US009437271B2

(12) United States Patent
Lee

(10) Patent No.: US 9,437,271 B2
(45) Date of Patent: Sep. 6, 2016

(54) ELECTRONIC DEVICES HAVING SEMICONDUCTOR MAGNETIC MEMORY UNITS

(71) Applicant: SK hynix Inc., Icheon-si (KR)

(72) Inventor: Ji-Wang Lee, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 78 days.

(21) Appl. No.: 14/058,079

(22) Filed: Oct. 18, 2013

(65) Prior Publication Data

US 2014/0244930 A1 Aug. 28, 2014

(30) Foreign Application Priority Data

Feb. 28, 2013 (KR) .......................... 10-2013-0022184

(51) Int. Cl.
*G06F 3/00* (2006.01)
*G11C 11/16* (2006.01)
*G11C 13/00* (2006.01)

(52) U.S. Cl.
CPC ....... *G11C 11/1673* (2013.01); *G11C 13/0004* (2013.01); *G11C 13/004* (2013.01); *G11C 13/0007* (2013.01); *G11C 2013/0045* (2013.01); *G11C 2013/0054* (2013.01); *G11C 2213/79* (2013.01)

(58) Field of Classification Search
None
See application file for complete search history.

(56) References Cited

U.S. PATENT DOCUMENTS

| | | | | |
|---|---|---|---|---|
| 5,973,955 | A  * | 10/1999 | Nogle et al. ................... | 365/154 |
| 2009/0046496 | A1* | 2/2009 | Katoh ............................ | 365/148 |
| 2010/0046270 | A1* | 2/2010 | Katoh et al. ................... | 365/100 |
| 2010/0128512 | A1* | 5/2010 | Ohnishi et al. ................ | 365/145 |
| 2010/0321976 | A1* | 12/2010 | Jung et al. ..................... | 365/148 |
| 2012/0155168 | A1* | 6/2012 | Kim et al. ................ | 365/185.03 |
| 2012/0257437 | A1* | 10/2012 | Seko et al. ..................... | 365/148 |
| 2013/0148406 | A1* | 6/2013 | Shimakawa et al. .......... | 365/148 |
| 2014/0112055 | A1* | 4/2014 | Kawahara et al. ............ | 365/148 |

FOREIGN PATENT DOCUMENTS

KR 10-2012-0027540 3/2012
WO 2010148248 A1 12/2010

* cited by examiner

*Primary Examiner* — Henry Tsai
*Assistant Examiner* — Aurangzeb Hassan
(74) *Attorney, Agent, or Firm* — Perkins Coie LLP

(57) ABSTRACT

An electronic device comprising a semiconductor memory unit that includes a resistance variable element configured to be changed in a resistance value according to a value of data stored therein; a first reference resistance element having a first resistance value; a second reference resistance element having a second resistance value larger than the first resistance value; and a comparison unit configured to receive a voltage corresponding to the resistance value of the resistance variable element through a first input terminal and a second input terminal thereof, a voltage corresponding to the first resistance value of the first reference resistance element through a third input terminal, and a voltage corresponding to the second resistance value of the second reference resistance element through a fourth input terminal, the comparison unit configured to output a result of comparing inputs to the first input terminal and the second input terminal and inputs to the third input terminal and fourth input terminal.

23 Claims, 14 Drawing Sheets ance value of the second reference resistance element through a fourth input terminal, the comparison unit configured to output a result of comparing inputs to the first input terminal and the second input terminal and inputs to the third input terminal and fourth input terminal.

ELECTRONIC DEVICES HAVING SEMICONDUCTOR MAGNETIC MEMORY UNITS

CROSS-REFERENCE TO RELATED APPLICATIONS

This patent document claims priority of Korean Patent Application No. 10-2013-0022184 entitled "SEMICONDUCTOR DEVICE, PROCESSOR, SYSTEM AND METHOD FOR OPERATING SEMICONDUCTOR DEVICE" and filed on Feb. 28, 2013, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which can discriminate the data stored in a resistance variable element by using a simplified circuit, thereby reducing an area occupied by the device. Implementations of the disclosed technology can be used for applications involving a processor, a system and a method for operating an electronic device.

Various implementations are disclosed and directed to an electronic device which has a simple circuit configuration and includes a small number of elements, thereby decreasing influences exerted on discrimination of data by the errors of elements and improving precision.

In one aspect, an electronic device is provided to include a semiconductor memory unit that includes: a resistance variable element configured to be changed in a resistance value according to a value of data stored therein; a first reference resistance element having a first resistance value; a second reference resistance element having a second resistance value larger than the first resistance value; and a comparison unit configured to receive a voltage corresponding to the resistance value of the resistance variable element through a first input terminal and a second input terminal thereof, a voltage corresponding to the first resistance value of the first reference resistance element through a third input terminal, and a voltage corresponding to the second resistance value of the second reference resistance element through a fourth input terminal, the comparison unit configured to output a result of comparing inputs to the first input terminal and the second input terminal and inputs to the third input terminal and fourth input terminal.

Implementations of the above electronic device may include one or more the following.

The comparison unit may output a result of comparing a sum of the voltage inputted to the first input terminal and the voltage inputted to the second input terminal and a sum of the voltage inputted to the third input terminal and the voltage inputted to the fourth input terminal.

The comparison unit may be controlled in an amount of a current flowing therein, according to the voltages inputted to the first input terminal, the second input terminal, the third input terminal and the fourth input terminal, and outputs a result of comparing a sum of an amount of a current flowing in response to the voltage inputted to the first input terminal and an amount of a current flowing in response to the voltage inputted to the second input terminal with a sum of an amount of a current flowing in response to the voltage inputted to the third input terminal and an amount of a current flowing in response to the voltage inputted to the fourth input terminal. The resistance variable element may exhibit the first resistance value for storing first data and the second resistance value for storing the second data different from the first data.

The comparison result of the comparison unit may represent which data of the first data and the second data is the data stored in the resistance variable element.

The electronic device may further include: a first current source configured to supply a read current to the resistance variable element; a second current source configured to supply the read current to the first reference resistance element; and a third current source configured to supply the read current to the second reference resistance element.

In the electronic device, one end of the resistance variable element may be connected to the first input terminal and the second input terminal, one end of the first reference resistance element is connected to the third input terminal, one end of the second reference resistance element may be connected to the fourth input terminal, and a power supply voltage may be applied to the other ends of the resistance variable element, the first reference resistance element and the second reference resistance element.

In the electronic device, one end of the resistance variable element may be connected to the first input terminal and the second input terminal, one end of the first reference resistance element may be connected to the third input terminal, one end of the second reference resistance element may be connected to the fourth input terminal, and a ground voltage may be applied to the other ends of the resistance variable element, the first reference resistance element and the second reference resistance element.

The comparison unit may further include: a first current sourcing unit configured to source a current of a first node; a second current sourcing unit configured to source a current of a second node; a first current sinking unit configured to sink a current from the first node in response to the voltage inputted to the first input terminal and the voltage inputted to the second input terminal; and a second current sinking unit configured to sink a current from the second node in response to the voltage inputted to the third input terminal and the voltage inputted to the fourth input terminal.

The resistance variable element may include a metal oxide, a phase change substance or a structure in which a tunnel barrier layer is interposed between two ferromagnetic layers.

The electronic device may further include a microprocessor which includes: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and wherein the semiconductor memory unit is configured to be in communication with the control unit and the operation unit of the microprocessor to store data for performing the operation, data corresponding to a result of performing the operation, or an address of data for which the operation is performed.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between (1) the processor, the auxiliary memory device or the main memory device and (2) the outside, wherein the semiconductor memory unit that includes the resistance variable element is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

The semiconductor memory unit may further include: in addition to the resistance variable element, a plurality of additional resistance variable elements each configured to be changed in a resistance value according to the value of the data stored therein; in addition to the first reference resistance element, one or more additional first reference resistance elements each having a respective first resistance value; and in addition to the second reference resistance element, one or more additional second reference resistance elements each having a respective second resistance value larger than the respective first resistance value; wherein the current source is configured to supply a read current to a resistance variable element selected among the plurality of resistance variable elements, a first reference resistance element corresponding to the selected resistance variable element among the first reference resistance elements and a second reference resistance element corresponding to the selected resistance variable element among the second reference resistance elements; and wherein the comparison unit is configured to receive a voltage of one end of the selected resistance variable element through a first input terminal and a second input terminal thereof, a voltage of one end of the first reference resistance element corresponding to the selected resistance variable element through the third input terminal thereof, and a voltage of one end of the second reference resistance element corresponding to the selected resistance variable element through the fourth input terminal thereof, and the comparison unit is operable to output a result of comparing inputs to the first input terminal and the second input terminal and inputs to the third input terminal and the fourth input terminal.

In another aspect, an electronic device is provided to include a semiconductor memory unit that includes: a resistance variable element configured to be changed in a resistance value according to a value of data stored therein; a first reference resistance element having a first resistance value; a second reference resistance element having a second resistance value larger than the first resistance value; and a comparison unit configured to receive a voltage corresponding to the resistance value of the resistance variable element through an input terminal thereof, a voltage corresponding to the first resistance value of the first reference resistance element through a first input bar terminal thereof, and a voltage corresponding to the second resistance value of the second reference resistance element through a second input bar terminal thereof, and output a result of comparing an input to the input terminal and inputs to the first input bar terminal and the second input bar terminal.

Implementations of the above electronic device may include one or more the following.

The comparison unit may output a result of comparing the voltage inputted to the input terminal with a voltage having a voltage level between the voltage inputted to the first input bar terminal and the voltage inputted to the second input bar terminal.

The comparison unit may be controlled in an amount of a current flowing therein, according to the voltages inputted to the input terminal, the first input bar terminal and the second input bar terminal, and outputs a result of comparing an amount of a current flowing in response to the voltage inputted to the input terminal with a sum of an amount of a current flowing in response to the voltage inputted to the first input bar terminal and an amount of a current flowing in response to the voltage inputted to the second input bar terminal.

The resistance variable element may have the first resistance value in the case where first data is stored therein and the second resistance value in the case where second data with a value different from the first data is stored therein.

The comparison unit may include: a first current sourcing unit configured to source a current of a first node; a second current sourcing unit configured to source a current of a second node; a first current sinking unit configured to sink a current from the first node in response to the voltage inputted to the input terminal; and a second current sinking unit configured to sink a current from the second node in response to the voltage inputted to the first input bar terminal and the voltage inputted to the second input bar terminal.

The resistance variable element may include at least one among a metal oxide, a phase change substance or a structure in which a tunnel barrier layer is interposed between two ferromagnetic layers.

The electronic device may further include a microprocessor which includes: a control unit that is configured to receive a signal including a command from an outside of the microprocessor, and performs extracting, decoding of the command, or controlling input or output of a signal of the microprocessor; and an operation unit configured to perform an operation based on a result that the control unit decodes the command; and wherein the semiconductor memory unit is configured to be in communication with the control unit and the operation unit of the microprocessor to store data for performing the operation, data corresponding to a result of performing the operation, or an address of data for which the operation is performed.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between (1) the processor, the auxiliary memory device or the main memory device and (2) the outside, wherein the semiconductor memory unit that includes the resistance variable element is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

The semiconductor memory unit may further include: in addition to the resistance variable element, a plurality of additional resistance variable elements each configured to be changed in a resistance value according to the value of the data stored therein; in addition to the first reference resistance element, one or more additional first reference resistance elements each having a respective first resistance value; and in addition to the second reference resistance element, one or more additional second reference resistance elements each having a respective second resistance value larger than the respective first resistance value; wherein the current source is configured to supply a read current to a resistance variable element selected among the plurality of resistance variable elements, a first reference resistance element corresponding to the selected resistance variable element among the first reference resistance elements and a second reference resistance element corresponding to the selected resistance variable element among the second reference resistance elements; and wherein the comparison unit is configured to receive a voltage of one end of the selected resistance variable element through a first input terminal and a second input terminal thereof, a voltage of one end of the first reference resistance element corresponding to the selected resistance variable element through the third input terminal thereof, and a voltage of one end of the second reference resistance element corresponding to the selected resistance variable element through the fourth input terminal thereof, and the comparison unit is operable to output a result of comparing inputs to the first input terminal and the second input terminal and inputs to the third input terminal and the fourth input terminal.

The semiconductor memory unit may further include: in addition to the resistance variable element, a plurality of additional resistance variable elements each configured to be changed in a resistance value according to the value of the data stored therein; in addition to the first reference resistance element, one or more additional first reference resistance elements each having a respective first resistance value; and in addition to the second reference resistance element, one or more additional second reference resistance elements each having a respective second resistance value larger than the first respective resistance value, wherein the current source is configured to supply a read current to a resistance variable element selected among the plurality of resistance variable elements, a first reference resistance element corresponding to the selected resistance variable element among the one or more first reference resistance elements and a second reference resistance element corresponding to the selected resistance variable element among the one or more second reference resistance elements; and wherein the comparison unit is configured to receive a voltage of one end of the selected resistance variable element through an input terminal thereof, a voltage of one end of the first reference resistance element corresponding to the selected resistance variable element through the first input bar terminal thereof, and a voltage of one end of the second reference resistance element corresponding to the selected resistance variable element through the second input bar terminal thereof, and the comparison unit is operable to output a result of comparing an input to the input terminal and inputs to the first input bar terminal and the second input bar terminal.

In another aspect, a method is provided for operating a semiconductor device, including a resistance variable element which is changed in its resistance value according to a value of data stored therein, a first reference resistance element which has a first resistance value and a second reference resistance element which has a second resistance value larger than the first resistance value. This method includes: supplying a read current to the resistance variable element, the first reference resistance element and the second reference resistance element; producing a first current in response to a voltage of one end of the resistance variable element, a second current in response to a voltage of one end of the first reference resistance element and third current in response to a voltage of one end of the second reference resistance element; and outputting a result of comparing a current amount of the first current with a sum of current amounts of the second current and the third current.

Implementations of the above method may include one or more the following.

The resistance variable element may have the first resistance value in the case where first data is stored therein and the second resistance value in the case where second data with a value different from the first data is stored therein.

In yet another aspect, an electronic device is provided to include a semiconductor memory unit which includes: a resistance variable element configured to be changed in a resistance value according to a value of data stored therein; a first reference resistance element having a first resistance value; a second reference resistance element having a second resistance value larger than the first resistance value; a voltage generation unit configured to receive a voltage corresponding to the first resistance value of the first reference resistance element through a first input terminal thereof, and a voltage corresponding to the second resistance value of the second reference resistance element through a second input terminal thereof, including a first input bar terminal and a second input bar terminal connected with an output terminal thereof, and the voltage generation unit further configured to output a voltage having a voltage level between an input to the first input terminal and an input to the second input terminal, to the output terminal; and a comparison unit configured to output a result of comparing a voltage corresponding to the resistance value of the resistance variable element and the voltage outputted to the output terminal of the voltage generation unit.

Implementations of the above electronic device may include one or more the following.

The resistance variable element may have the first resistance value in the case where first data is stored therein and the second resistance value in the case where second data with a value different from the first data is stored therein.

The comparison result of the comparison unit may represent which data of the first data and the second data is the data stored in the resistance variable element.

The semiconductor memory unit may include: a plurality of additional resistance variable elements each configured to be changed in its resistance value according to the value of the data stored therein; one or more additional first reference resistance elements each having a respective first resistance value; one or more additional second reference resistance elements each having a respective second resistance value larger than the first resistance value; and a current source configured to supply a read current to a resistance variable element selected among the plurality of resistance variable elements, a first reference resistance element corresponding to the selected resistance variable element among the one or more first reference resistance elements and a second reference resistance element corresponding to the selected resistance variable element among the one or more second reference resistance elements, wherein the voltage generation unit is configured to receive a voltage of one end of the first reference resistance element corresponding to the selected resistance variable element through a first input terminal thereof, and a voltage of one end of the second reference resistance element corresponding to the selected resistance variable element through a second input terminal thereof, including a first input bar terminal and a second input bar terminal connected with an output terminal thereof, and further configured to output a voltage having a voltage level between an input to the first input terminal and an input to the second input terminal, to the output terminal.

The electronic device may further include a microprocessor which includes: a control unit that is configured to receive a signal including a command from an outside of the microprocessor, and performs extracting, decoding of the command, or controlling input or output of a signal of the microprocessor; and an operation unit configured to perform an operation based on a result that the control unit decodes the command; and wherein the semiconductor memory unit is configured to be in communication with the control unit and the operation unit of the microprocessor to store data for performing the operation, data corresponding to a result of performing the operation, or an address of data for which the operation is performed.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between (1) the processor, the auxiliary memory device or the main memory device and (2) the outside, wherein the semiconductor memory unit that includes the resistance variable element is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

The above implementations may be used to achieve one or more advantages. For example, in an electronic device, since a voltage corresponding to the resistance value of a resistance variable element, a voltage corresponding to the resistance value of a first reference resistance element and a voltage corresponding to the resistance value of a second reference resistance element are compared all at once, it is not necessary in the present device to separately generate a reference voltage to discriminate data. As a consequence, a circuit configuration may become simple and the circuit area may be reduced. For another example, an implementation of the disclosed technology can render the circuit configuration simple and to include a small number of elements and accordingly, influences exerted on discrimination of data by the errors of elements are decreased, and data discriminating precision may be improved.

These and other aspects, implementations and associated advantages are described in greater detail in the drawings, the description and the claims.

DETAILED DESCRIPTION

Various examples and implementations of the disclosed technology are described below in detail with reference to the accompanying drawings.

A semiconductor device implementing memory circuitry based on the disclosed technology may include a resistance variable element. In the following examples, a resistance variable element can exhibit a resistance variable characteristic and may include a single layer or a multi-layer. For example, a resistance variable element may include substances used in an RRAM, a PRAM, an MRAM, an FRAM, etc. and such a substance may include, for example, a chalcogenide-based compound, a transition metal compound, a ferroelectric, a ferromagnetic, and so on. A suitable substance for implementing the disclosed technology is not limited to these listed substances and can be a substance or material as a part of a resistance variable element exhibiting a resistance variable characteristic to switch between different resistant states in response to a voltage or current applied to both ends thereof.

In some implementations, a resistance variable element may include a metal oxide. For example, the metal oxide may be a transition metal oxide such as a nickel (Ni) oxide, a titanium (Ti) oxide, a hafnium (Hf) oxide, a zirconium (Zr) oxide, a tungsten (W) oxide and a cobalt (Co) oxide or a perovskite-based substance such as STO (SrTiO) and PCMO (PrCaMnO). Such a resistance variable element can be switched between different resistant states due to creation and extinction of current filaments through behavior of vacancies.

In other implementations, a resistance variable element may include a phase change substance. For example, the phase change substance may be a chalcogenide-based substance such as GST (Ge—Sb—Te). This resistance variable element can be switched between different resistant states by being stabilized in a crystalline state and an amorphous state by heat.

In yet other implementations, a resistance variable element may include a structure in which a tunneling barrier layer is interposed between two ferromagnetic layers. The ferromagnetic layers may be formed using a substance such as NiFeCo and CoFe, and the tunneling barrier layer may be formed using a substance such as Al2O3. The resistance variable element can be switched between different resistant states based on magnetization directions of the ferromagnetic layers. For example, in the case where the magnetization directions of the two ferromagnetic layers are parallel to each other, the resistance variable element may be in a low resistant state, and, in the case where the magnetization directions of the two ferromagnetic layers are not parallel to each other, the resistance variable element may be in a high resistant state.

Figure 1:
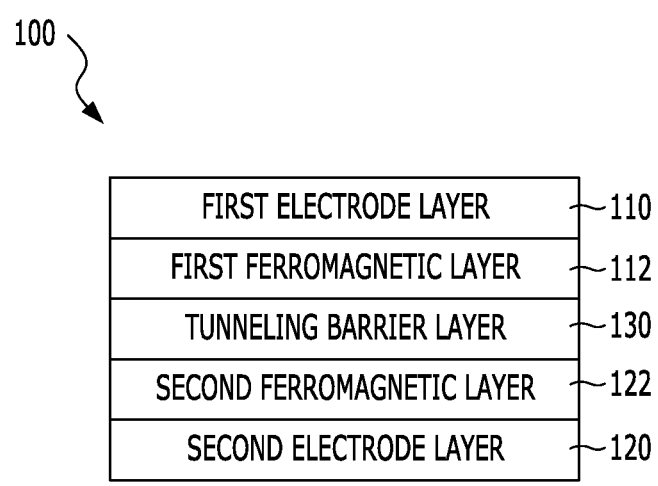
FIG. 1 is a diagram showing an example of a magnetic tunnel junction (MTJ) element as one of structures in which a tunneling barrier layer is interposed between two ferromagnetic layers.

FIG. 1 is a diagram showing an example of a magnetic tunnel junction (MTJ) element as part of a resistance variable element in which a tunneling barrier layer is interposed between two ferromagnetic layers.

Referring to FIG. 1, an MTJ element 100 includes a first electrode layer 110 as a top electrode, a second electrode layer 120 as a bottom electrode, a first ferromagnetic layer 112 and a second ferromagnetic layer 122 as a pair of ferromagnetic layers, and a tunneling barrier layer 130 which is formed between the pair of ferromagnetic layers 112 and 122.

The first ferromagnetic layer 112 is a free ferromagnetic layer of which magnetization direction may be changed according to a direction of a current applied to the MTJ element 100, and the second ferromagnetic layer 122 is a pinned ferromagnetic layer of which magnetization direction is pinned at a fixed magnetization direction.

The MTJ element 100 can change its resistance value based on a direction of an applied current, and records data "0" or "1" corresponding to a particular resistance value between two resistance values such as a high resistance value and a low resistance value.

Figure 2A:
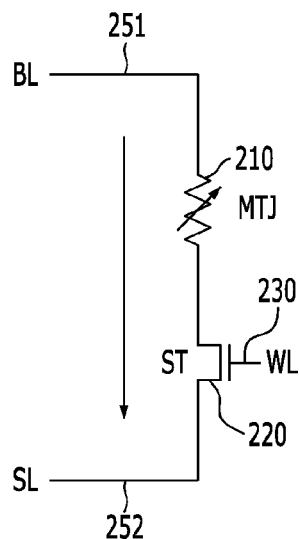
FIGS. 2A and 2B are views explaining a principle of storing data in a resistance variable element.
Figure 2B:
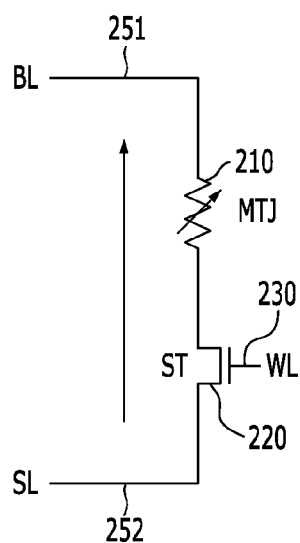

FIGS. 2A and 2B show operations of an example memory circuit having a resistance variable element 210 to explain a principle of storing data in the resistance variable element. The resistance variable element 210 (R) may be, for example, the MTJ element 100 described above with reference to FIG. 1. The memory circuit includes a select transistor 220 (ST) having a terminal 230 in form of a word line (WL) and the resistance variable element 210 connected in series between two terminals represented by a bit line (BL) 251 and a source line (SL) 252 as a 3-terminal circuit. The select transistor 220 (ST) is provided to select or de-select the resistance variable element 210.

First, FIG. 2A is a diagram explaining a principle of recording data with a low logic value in the resistance variable element 210 (R). To select the resistance variable element 210 (R) in which data is to be stored, the word line WL 230 for the resistance variable element 210 (R) is activated to turn on the select transistor 220 (ST) for selecting the element 210. As the current flows from one end to the other end (in the direction indicated by the arrow), that is, from the first electrode layer 110 as a top electrode to the second electrode layer 120 as a bottom electrode in the MTJ element 100 shown in FIG. 1, the magnetization direction of the first ferromagnetic layer 112 as a free ferromagnetic layer and the magnetization direction of the second ferromagnetic layer 122 as a pinned ferromagnetic layer become parallel to each other, and the resistance variable element 210 (R) is in a low resistance state. When the resistance variable element 210 (R) is in the low resistance state, a "low" data is stored in the resistance variable element 210 (R).

Next, FIG. 2B is a diagram explaining a principle of recording data with a high logic value in the resistance variable element 210 (R). In a similar manner, the word line WL 230 connected to the resistance variable element 210 (R) is activated to turn on the select transistor 220 (ST). As the current flows from the other end to one end (in the direction indicated by the arrow), that is, from the second electrode layer 120 to the first electrode layer 110 in the MTJ element 100 shown in FIG. 1, the magnetization direction of the first ferromagnetic layer 112 and the magnetization direction of the second ferromagnetic layer 122 become anti-parallel to each other, and the resistance variable element 210 (R) is in a high resistance state. When the resistance variable element 210 (R) is in the high resistance state, a "high" data is stored in the resistance variable element 210 (R).

FIGS. 3-10 show examples of memory circuits having resistance variable elements as described above and circuit drivers that are connected via conductor lines.

Figure 3:
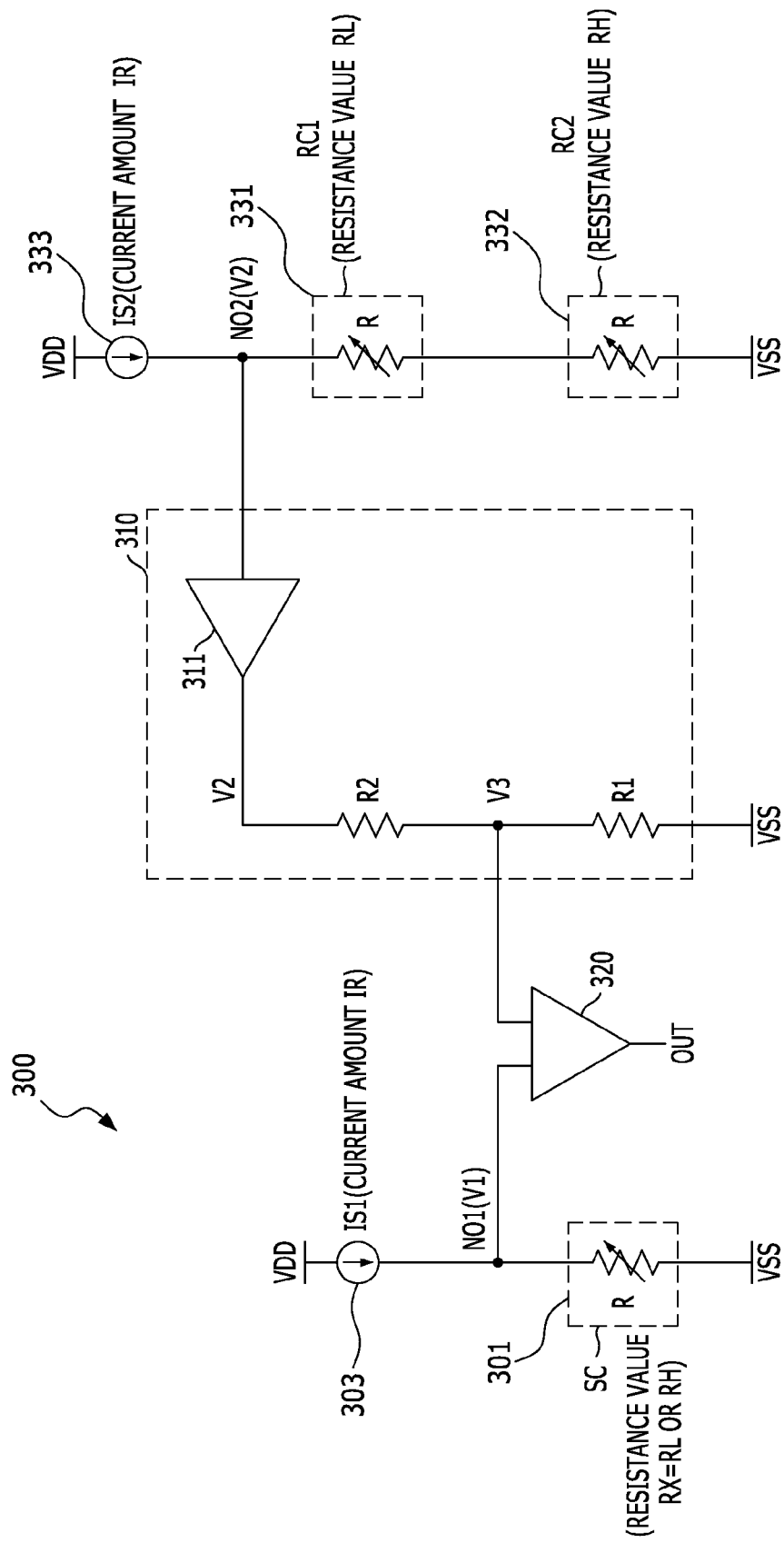
FIG. 3 shows an example of a configuration diagram of a semiconductor device for reading data stored in a storage cell which includes a resistance variable element.

FIG. 3 shows an example of a configuration diagram of a semiconductor device 300 for reading the data stored in a storage cell 301 which includes a resistance variable element R, which can be, e.g., the resistance variable element 210 in FIGS. 2A and 2B.

Referring to FIG. 3, to read the data stored in a storage cell 301 (SC), the semiconductor device 300 includes a first reference cell 331 (RC1) which includes a resistance variable element of a low resistance state, a second reference cell 332 (RC2) which includes a resistance variable element of a high resistance state, current sources 303 (IS1) and 333 (IS2) which supply read currents IR to the cells SC, RC1 and RC2, a voltage division unit 310, and a comparison unit 320. The RC1 and RC2 are connected in series to receive the respective current IR from the current source 333 (IS2). The storage cell 301 (SC) is connected to the current source 303 (IS1) to receive its current IR. The comparator 320 has one input coupled to the storage cell 301 (SC) and another input to receive a reference input from the voltage division unit 310 based on a reference provided by reference cells 331 and 332. The storage cell 301 (SC), the voltage division unit 310 and the second reference cell 332 (RC2) are coupled to the ground voltage VSS.

While a single storage cell 301 (SC) and its reference cells 331 (RC1) and 332 (RC2) are shown in FIG. 3 for the sake of convenience in explanation of a read operation, the semiconductor device 300 can include a number of such storage cells and their corresponding reference cells arranged in the form of a matrix.

A read operation of the semiconductor device 300 in FIG. 3 are described below.

The semiconductor device 300 shown in FIG. 3 discriminates whether the data stored in the storage cell 301 (SC) is low or high, using a scheme of comparing voltages by using the comparator 320. In the read operation, the first current source 303 (IS1) supplies the read current IR to the storage cell 300 (SC), and the second current source 333 (IS2) supplies the read current IR to the first reference cell 303 (RC1) and the second reference cell 332 (RC2). The resistance value of the storage cell 301 (SC) is RX, the resistance value of the first reference cell 331 (RC1) is RL, and the resistance value of the second reference cell 332 (RC2) is RH. The resistance value RX of the storage cell 301 (SC) becomes RL when the value stored in the storage cell SC is low and RH in the case where the value stored in the storage cell SC is high. It is assumed that the current amount of the read current IR is IR.

When the read currents IR flow to the cells 301 (SC), 331 (RC1) and 332 (RC2), a first voltage V1 is generated at one end NO1 of the storage cell 301 (SC) as the first input to the comparator 320, and a second voltage V2 is generated at one end NO2 of the first reference cell 331 (RC1). The voltage division unit 310 divides the second voltage V2 with a predetermined division ratio and generates a third voltage V3 which is the second input to the comparator 320. The voltage level of the first voltage V1 becomes RX*IR through multiplying the resistance value of the storage cell SC and the current amount of the read current IR. The voltage level of the second voltage V2 becomes (RL+RH)*IR through multiplying the sum of the resistance values of the first reference cell RC1 and the second reference cell RC2 by the current amount of the read current IR. In the case where the division ratio is X/Y (Y≥X), the voltage level of the third voltage V3 is X/Y*V2, that is, (X/Y)*(RL+RH)*IR. Hereinafter, descriptions will be made for an example where the division ratio is 1/2 and the level of the third voltage V3 is (1/2)*(RL+RH)*IR.

The voltage division unit 310 may include a voltage buffer 311 which outputs the second voltage V2 as is, to generate the third voltage V3 in such a way as to prevent the occurrence of a load effect, and resistors R1 and R2 which divide the output of the voltage buffer 311 with the predetermined division ratio and generate the third voltage V3. In the example where the division ratio of the voltage division unit 310 is set to 1/2, the resistance value of the first resistor R1 and the resistance value of the second resistor R2 may be equal to each other. The description of some of the examples below uses the voltage division ratio of 2.

The comparison unit 320 outputs a result of comparing the first voltage V1 and the third voltage V3, to an output node OUT. In the case where the data stored in the storage cell 301 (SC) is low, the first voltage V1 is RL*IR and the first voltage V1 is smaller than the third voltage V3. Accordingly, when the first voltage V1 is smaller than the third voltage V3 as a comparison result of the comparison unit 320, the value stored in the storage cell 301 (SC) is defined to be a "low" state. Conversely, when the data stored in the storage cell 301 (SC) is high, the first voltage V1 is RH*IR and the first voltage V1 is larger than the third voltage V3. Accordingly, in the case where the first voltage V1 is larger than the third voltage V3 as a comparison result of the comparison unit 320, the value stored in the storage cell SC is high or in a "high" state.

In the device 300 in FIG. 3 described above, the value stored in the storage cell 301 (SC) is discriminated using a voltage which has a value between RL*IR and RH*IR. Since the semiconductor device 300 additionally includes the voltage buffer 311 and the resistors R1 and R2 to generate such a voltage, a substantial area is needed for accommodating the voltage buffer 311 and resistors R1 and R2, thus increasing the size of the circuit. Also, several steps such as steps for generating the second voltage V2 by supplying a current through resistive elements and dividing the generated voltage using the voltage buffer 311 and the resistors R1 and R2 are needed in order to generate the third voltage V3, and a number of elements are used to generate the third voltage V3. As a consequence, the precision in the readout of the device 300 is likely to deteriorate due to the errors or variations of the respective elements.

Figure 4A:
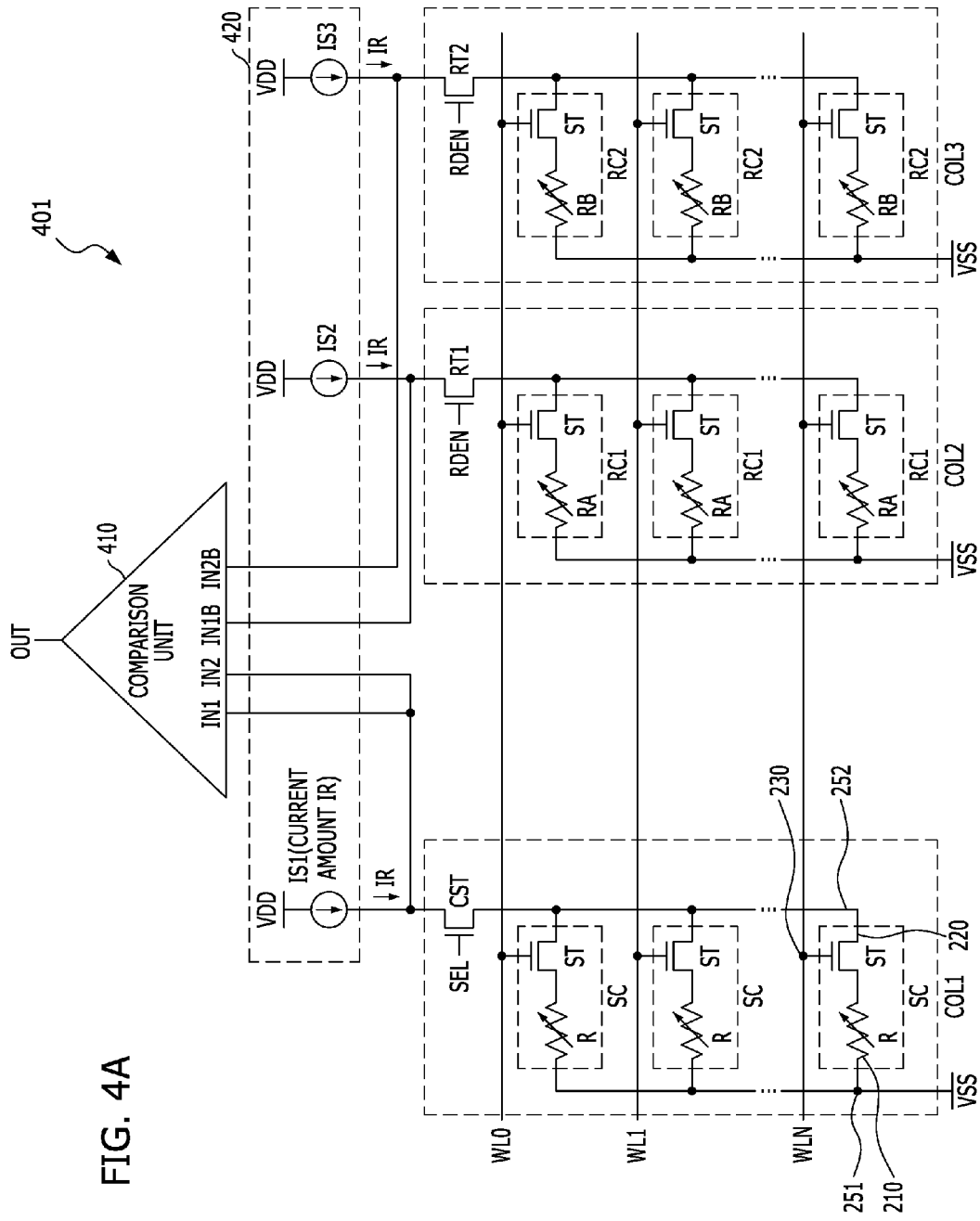
FIGS. 4A and 4B show examples of configuration diagrams of a semiconductor device having memory cells in two different electrical voltage conditions based on one implementation of the disclosed technology.
Figure 4B:
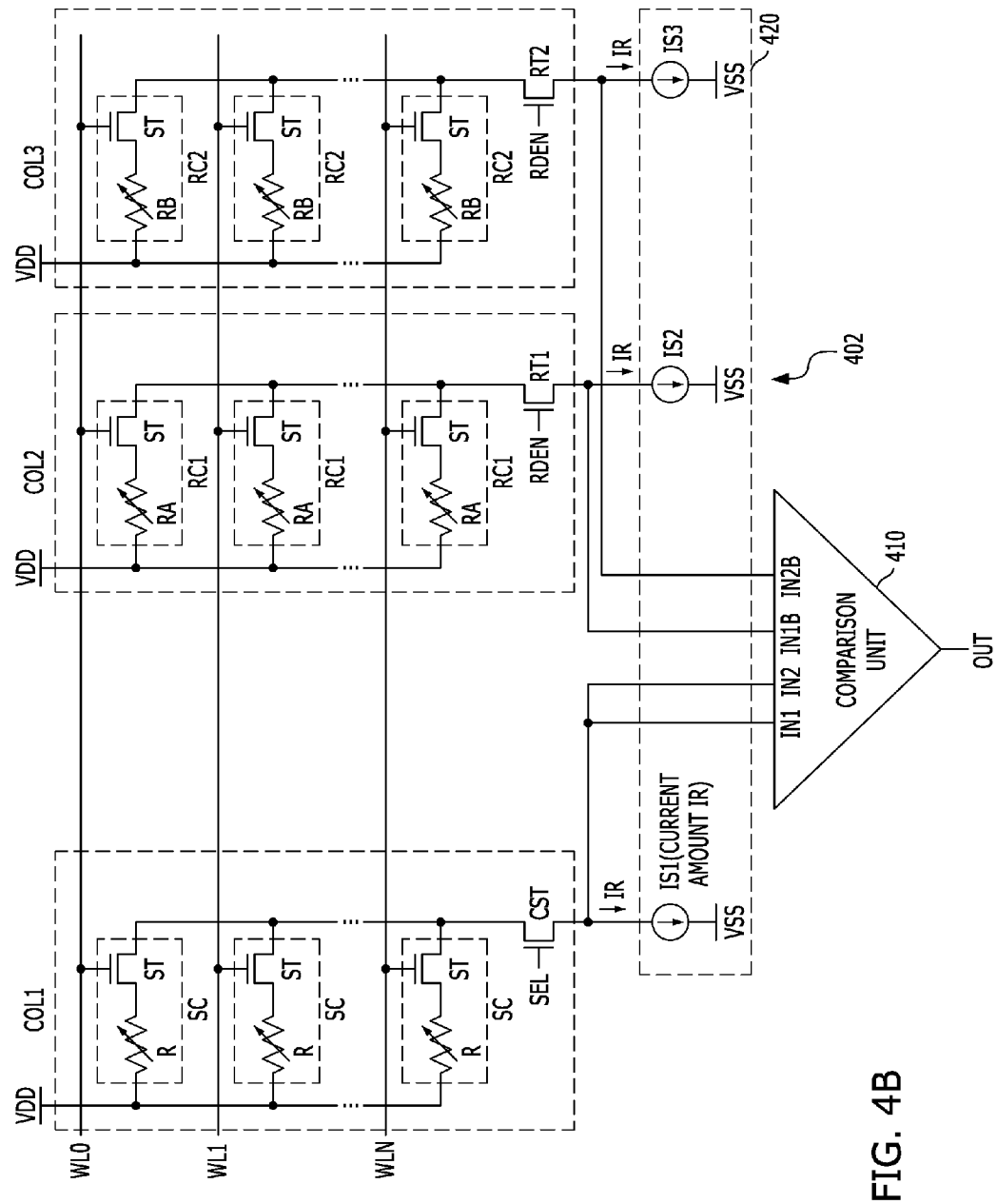
Figure 5:
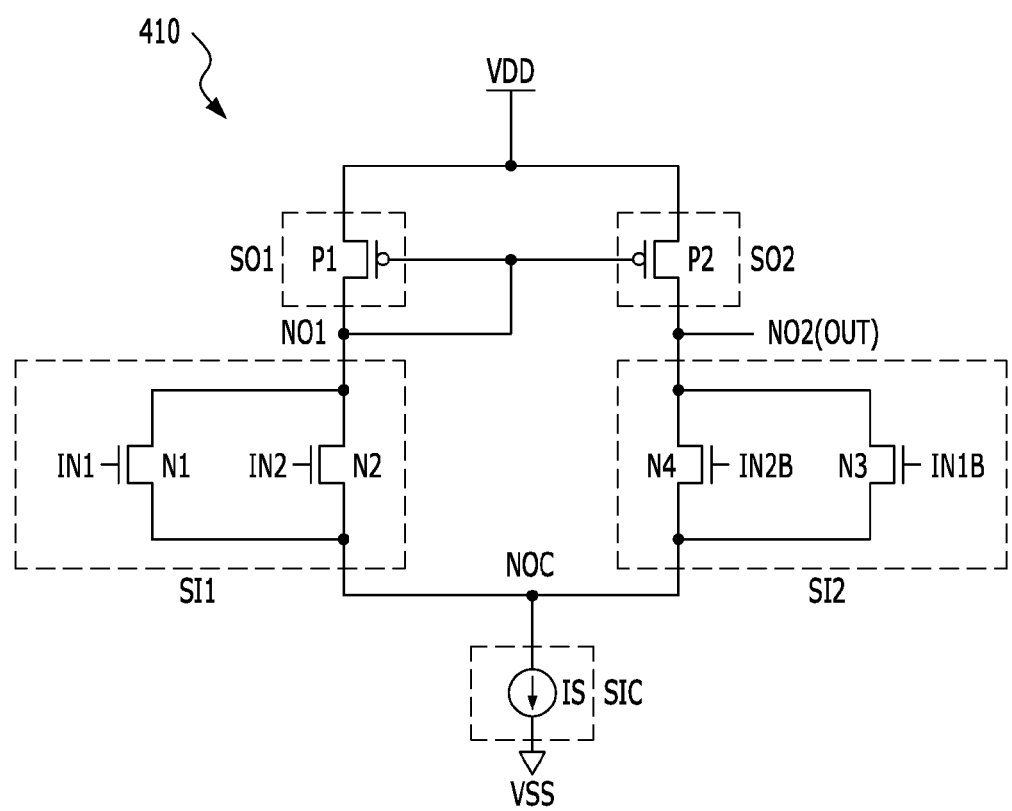
FIG. 5 shows an example of a configuration diagram of the comparison unit included in the semiconductor device of FIG. 4A or 4B.
Figure 6:
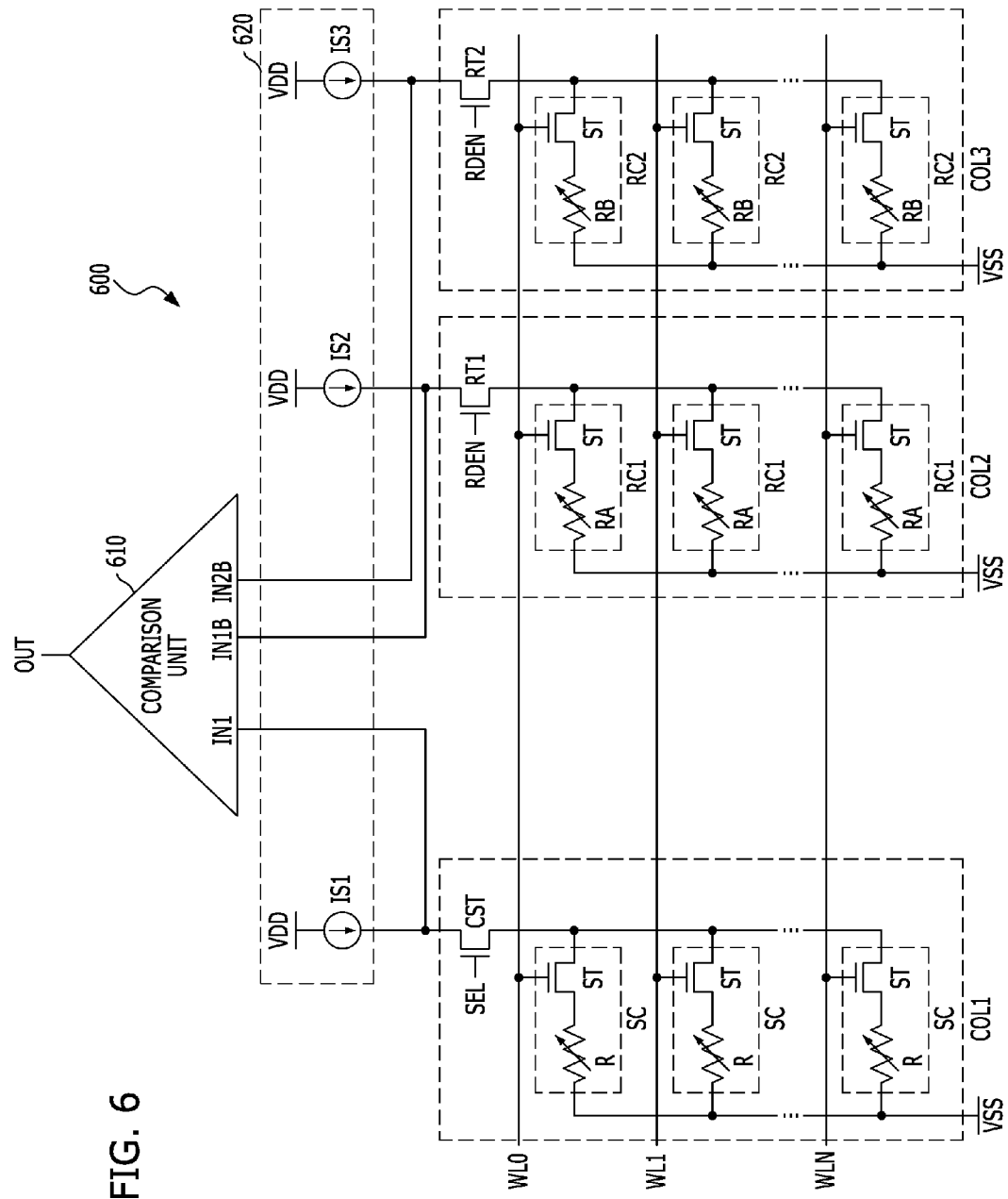
FIG. 6 shows an example of a configuration diagram of a semiconductor device having memory cells based on another implementation of the disclosed technology.
Figure 7:
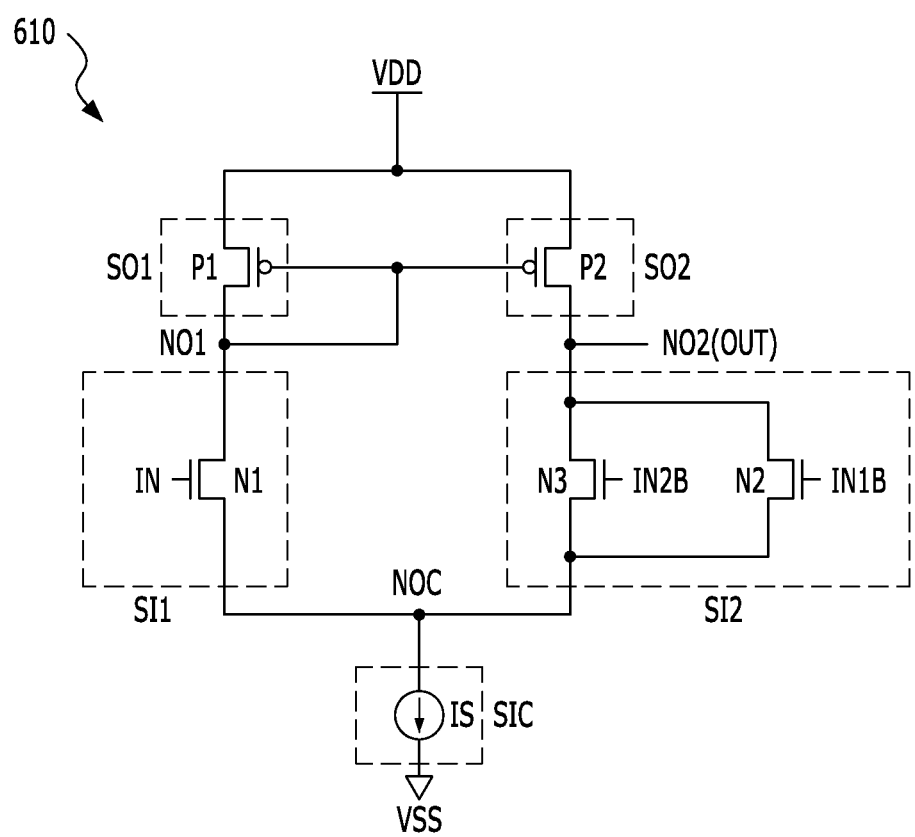
FIG. 7 shows an example of a configuration diagram of the comparison unit included in the semiconductor device of FIG. 6.
Figure 8:
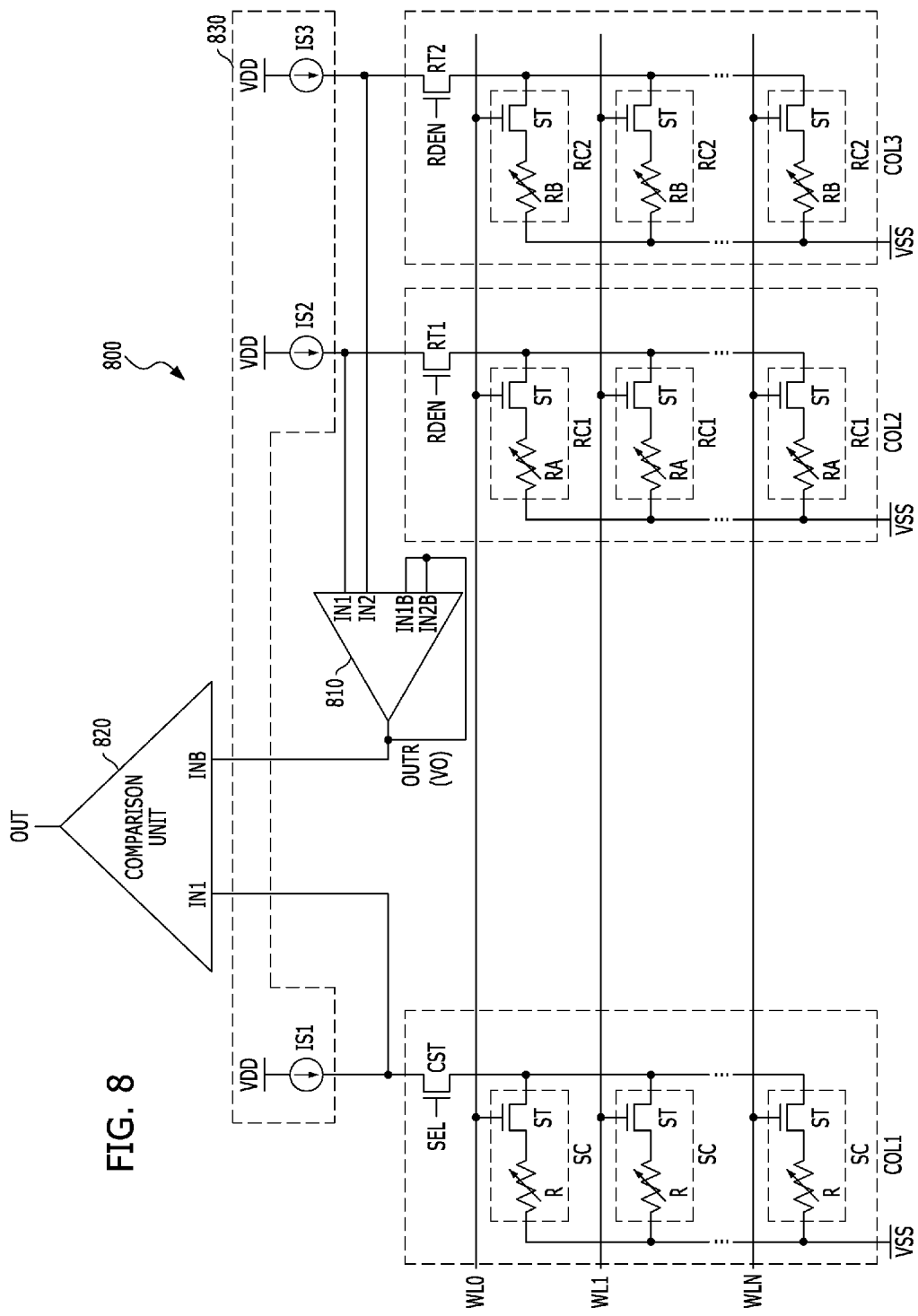
FIG. 8 shows an example of a configuration diagram of a semiconductor device having memory cells based on yet another implementation of the disclosed technology.

FIGS. 4A-10 provide examples of devices, circuit elements and methods for implementing the disclosed technology to reduce the device size and to maintain the accurate output precision. FIGS. 4, 6 and 8 illustrate three different examples for the circuit configurations and each circuit configuration may be two different electrical voltage configurations as illustrated in FIGS. 4A and 4B based on a common circuit configuration.

FIGS. 4A and 4B show examples of configuration diagrams of semiconductor devices 401 and 402 based on the same circuit configurations in two different electrical voltage configurations. FIG. 4A shows a device 401 in which a ground voltage VSS is applied to the ends of cells opposite to the ends of the cells that are coupled to a current source 420 and a comparison unit 410. FIG. 4B shows a device 402 in an opposite electrical configuration in which a power supply voltage VDD is applied to the same ends of cells as in FIG. 4A while the opposite ends of the cells being coupled to the current source 420 and the comparison unit 410.

Referring to FIG. 4A, the semiconductor device 401 includes a plurality of resistance variable elements R each configured to be changed in its resistance value according to the value of the data stored therein, one or more first reference resistance elements RA each having a first resistance value, one or more second reference resistance elements RB each having a second resistance value larger than the first resistance value, and a comparison unit 410 configured to be inputted with a voltage corresponding to the resistance value of the resistance variable element R through a first input terminal IN1 and a second input terminal IN2 thereof, be inputted with a voltage corresponding to the first resistance value of the first reference resistance element RA through a first input bar terminal IN1B thereof (i.e., a third input terminal), be inputted with a voltage corresponding to the second resistance value of the second reference resistance element RB through a second input bar terminal IN2B thereof (i.e., a fourth input terminal), and output a result of comparing inputs to the first input terminal IN1 and the second input terminal IN2 and inputs to the first input bar terminal IN1B and the second input bar terminal IN2B. The semiconductor device 401 further includes a current source 420 configured to supply a read current IR to a resistance variable element R selected among the plurality of resistance variable elements R, a first reference resistance element RA corresponding to the selected resistance variable element R among the one or more first reference resistance elements RA and a second reference resistance element RB corresponding to the selected resistance variable element R among the one or more second reference resistance elements RB.

Hence, the semiconductor device 401 includes the plurality of resistance variable elements R, and one or more first reference resistance elements RA and one or more second reference resistance elements RB for discriminating the value of the data stored in a resistance variable element R selected among the plurality of resistance variable elements R. The resistive elements R, RA and RB are connected with select transistors 220 (ST) respectively associated with R, RA and RB. The select transistors 220 (ST) are connected with word lines among a plurality of word lines WL0 to WLN. Referring back to FIGS. 2A and 2B, each cell is a 3-terminal circuit where the current can be in one of the two directions to provide two variable resistance values, respectively.

The resistance variable element R becomes a low resistance state (with a resistance value RL) in the case where first data is stored therein. Conversely, the resistance variable element R becomes a high resistance state (with a resistance value RH) in the case where second data is stored therein. The first data may be defined as low data and the second data may be defined as high data, or the first data may be defined as high data and the second data may be defined as low data. The first reference resistance element RA is a low resistance state, and the second reference resistance element RB is a high resistance state. Hereinbelow, the resistance variable element R and its corresponding select transistor ST are collectively referred to as a storage cell SC, the first reference resistance element RA and the corresponding select transistor ST are collectively referred to as a first reference cell RC1, and the second reference resistance element RB and the corresponding select transistor ST are collectively referred to as a second reference cell RC2.

The semiconductor device 401 includes a cell array in which a plurality of storage cells SC forming a storage cell column or array, a plurality of first reference cells RC1 forming a first reference cell column or array and a plurality of second reference cells RC2 forming a second reference cell column or array are disposed in the form of a matrix. The semiconductor device 401 may include several columns each including a plurality of storage cells SC. These columns may be connected to one comparison unit 410. In a read operation, a column selected by an address is electrically connected with the comparison unit 410. For the sake of convenience in explanation, in FIG. 4A, there are shown a first column COL1 including a plurality of storage cells SC, a second column COL2 including a plurality of first reference cells RC1, and a third column COL3 including a plurality of second reference cells RC2. If the first column COL1 is selected, a column select signal SEL is activated and a column select transistor CST is turned on, by which the first column COL1 and the comparison unit 410 are electrically connected with each other. Similarly, a select reference transistor RT1 or RT2 is provided in each of the two reference cell arrays.

At least one first reference cell RC1 and at least one second reference cell RC2 included in the semiconductor device 401 correspond to at least one storage cell SC. It is shown in FIG. 4A that one first reference cell RC1 and one second reference cell RC2 correspond to one storage cell SC, and the cells SC, RC1 and RC2 corresponding to one another are connected to the same word line. If a read enable signal RDEN which is activated for a read period is activated, select transistors RT1 and RT2 are turned on, and the second column COL2 and the third column COL3 are electrically connected with the comparison unit 410.

The semiconductor device 401 can be operated to activate a word line corresponding to the inputted address among the plurality of word lines WL0 to WLN in the read operation. The semiconductor device 401 reads the data of a storage cell SC which is connected with the activated word line. The select transistors ST of the cells SC, RC1 and RC2 which are connected with the activated word line are turned on, and accordingly, a current may flows through each of the resistive elements R, RA and RB of the cells SC, RC1 and RC2.

The current source 420 generates and supplies the read current IR to a selected storage cell SC, a first reference cell RC1 corresponding to the selected storage cell SC and a second reference cell RC2 corresponding to the selected storage cell SC in the read operation. For this operation, the current source 420 can include a first current source IS1 which supplies the read current IR to the selected storage cell SC, a second current source IS2 which supplies the read current IR to the first reference cell RC1, and a third current source IS3 which supplies the read current IR to the second reference cell RC2.

When the respective read currents IR flow through the storage cell SC, the first reference cell RC1 and the second reference cell RC2, voltage drops occur at both ends of the resistive elements R, RA and RB included in the cells SC, RC1 and RC2. The amounts of the currents flowing through the resistive elements R, RA and RB of the cells SC, RC1 and RC2 are set to be essentially the same, thus the voltage drops occur therein are proportional to the resistance values of the resistive elements R, RA and RB of the cells SC, RC1 and RC2, respectively. Therefore, voltages corresponding to the resistance values of the resistive elements R, RA and RB are generated at one ends of the cells SC, RC1 and RC2.

The comparison unit 410 is coupled to receive (1) a voltage corresponding to the resistance value of the selected resistance variable element R, through the first input terminal IN1 and the second input terminal IN2, (2) a voltage corresponding to the first resistance value of the first reference resistance element RA which corresponds to the selected resistance variable element R, through the first input bar terminal IN1B, and (3) a voltage corresponding to the second resistance value of the second reference resistance element RB which corresponds to the selected resistance variable element R, through the second input bar terminal IN2B. In operation, the comparison unit 410 outputs a result of comparing a first input IN1 and a second input IN2 with a first input bar IN1B and a second input bar IN2B.

In detail, the comparison unit 410 compares the sum of the voltage inputted to the first input terminal IN1 and the voltage inputted to the second input terminal IN2 with the sum of the voltage inputted to the first input bar terminal IN1B and the voltage inputted to the second input bar terminal IN2B. Accordingly, the comparison unit 410 outputs a result of comparing a value (hereinafter, referred to as a 'comparison voltage value') corresponding to two times the voltage corresponding to the resistance value of the selected resistance variable element R with a value (hereinafter, referred to as a 'reference voltage value') corresponding to the sum of the voltage corresponding to the first resistance value of the first reference resistance element RA and the voltage corresponding to the second resistance value of the second reference resistance element RB.

In the case where the resistance variable element R is the low resistance state, the value 2*RL corresponding to two times the resistance value of the resistance variable element R is smaller than the value RL+RH corresponding to the sum of the first resistance value of the first reference resistance element RA and the second resistance value of the second reference resistance element RB, and in the case where the resistance variable element R is the high resistance state, the value 2*RH corresponding to two times the resistance value of the resistance variable element R is larger than the value RL+RH corresponding to the sum of the first resistance value of the first reference resistance element RA and the second resistance value of the second reference resistance element RB. That is to say, a relative relationship in signal amplitude between the comparison voltage value and the reference voltage value varies according to the value stored in the resistance variable element R. Accordingly, the comparison result of the comparison unit 410 represents which data of the first data and the second data is stored in the selected resistance variable element R.

The output of the comparison unit 410 is controlled by an amount of the current flowing therein, according to the voltages inputted to the first input terminal IN1, the second input terminal IN2, the first input bar terminal IN1B and the second input bar terminal IN2B. The output of the comparison unit 410 represents a comparison between the sum (hereinafter, referred to as a 'comparison current value') of an amount of the current flowing in response to the voltage inputted to the first input terminal IN1 and an amount of the current flowing in response to the voltage inputted to the second input terminal IN2 with the sum (hereinafter, referred to as a 'reference current value') of an amount of the current flowing in response to the voltage inputted to the first input bar terminal IN1B and an amount of the current flowing in response to the voltage inputted to the second input bar terminal IN2B.

The current in the device 410 has a value corresponding to the voltages inputted to the input terminals IN1, IN2, IN1B and IN2B flows in the comparison unit 410. Therefore, the comparison current value corresponds to the comparison voltage value, and the reference current value corresponds to the reference voltage value. Accordingly, the comparison result of the comparison unit 410 represents which value between a low value and a high value is the value stored in the selected resistance variable element R.

The operations of the semiconductor device 401 in the case where the ground voltage VSS is applied to the ends of the cells SC, RC1 and RC2 as shown in FIG. 4A are described below.

Referring to FIG. 4A, one end of a selected storage cell SC is connected to the first input terminal IN1 and the second input terminal IN2, one end of a selected first reference cell RC1 is connected to the first input bar terminal IN1B, and one end of a selected second reference cell RC2 is connected to the second input bar terminal IN2B.

In a read operation, when the read currents IR are coupled to the selected cells SC, RC1 and RC2 by the current source 420, voltage drops occur at both ends of the resistive elements R, RA and RB of the cells SC, RC1 and RC2. Assuming that the resistance value of the resistance variable element R is RX, the voltage at one end of the resistance variable element R is VSS+IR*RX, the voltage at one end of the first reference resistance element RA is VSS+IR*RL, and the voltage of one end of the second reference resistance element RB is VSS+IR*RH. Accordingly, in the comparison unit 410, the voltage VSS+IR*RX is inputted as the first input IN1 and the second input IN2, the voltage VSS+IR*RL is inputted as the first input bar IN1B, and the voltage VSS+IR*RH is inputted as the second input bar IN2B.

The comparison unit 410 outputs a result of comparing the sum of the voltages inputted to the first input terminal IN1 and the second input terminal IN2 and the sum of the voltages inputted to the first input bar terminal IN1B and the second input bar terminal IN2B. The sum of the voltages inputted to the first input terminal IN1 and the second input terminal IN2 is 2*VSS+2*IR*RX, and the sum of the voltages inputted to the first input bar terminal IN1B and the second input bar terminal IN2B is 2*VSS+IR*RL+IR*RH. In the case where RX is RL, that is, in the case where the resistance variable element R is the low resistance state, the comparison voltage value is 2*VSS+2*IR*RL and is thus smaller than the reference voltage value. Conversely, in the case where RX is RH, that is, in the case where the resistance variable element R is the high resistance state, the comparison voltage value is 2*VSS+2*IR*RH and is thus larger than the reference voltage value. Accordingly, in the case where the comparison voltage value is smaller than the reference voltage value as a comparison result of the comparison unit 410, the resistance variable element R is the low resistance state, and in the case where the comparison voltage value is larger than the reference voltage value as a comparison result of the comparison unit 410, the resistance variable element R is the high resistance state.

The semiconductor device 402 in FIG. 4B has an electrical configuration opposite to the one in the device 401 in FIG. 4A. the grounded terminal coupled to the ground voltage VSS and the current source 420 and the comparator are at the same side of the cell arrays. Operations of the detailed configuration of the semiconductor device 402 of FIG. 4B are similar to operations of the detailed configuration of the semiconductor device 401 of FIG. 4A.

In a read operation of the device 402 in FIG. 4B, when the read current IR flows to the selected cells SC, RC1 and RC2 by the current source 420, voltage drops occur at both ends of the resistive elements R, RA and RB of the cells SC, RC1 and RC2. Assuming that the resistance value of the resistance variable element R is RX, the voltage of one end of the resistance variable element R is VDD−IR*RX, the voltage of one end of the first reference resistance element RA is VDD−IR*RL, and the voltage of one end of the second reference resistance element RB is VDD−IR*RH. Accordingly, in the comparison unit 410, the voltage VDD−IR*RX is inputted as the first input IN1 and the second input IN2, the voltage VDD−IR*RL is inputted as the first input bar IN1B, and the voltage VDD−SS+IR*RH is inputted as the second input bar IN2B.

The comparison unit 410 outputs a result of comparing the sum of the voltages inputted to the first input terminal IN1 and the second input terminal IN2 and the sum of the voltages inputted to the first input bar terminal IN1B and the second input bar terminal IN2B. The sum of the voltages inputted to the first input terminal IN1 and the second input terminal IN2 is 2*VDD−2*IR*RX, and the sum of the voltages inputted to the first input bar terminal IN1B and the second input bar terminal IN2B is 2*VDD−IR*RL−IR*RH. In the case where RX is RL, that is, in the case where the resistance variable element R is the low resistance state, the comparison voltage value is 2*VDD−2*IR*RL and is thus larger than the reference voltage value. Conversely, in the case where RX is RH, that is, in the case where the resistance variable element R is the high resistance state, the comparison voltage value is 2*VDD−2*IR*RH and is thus smaller than the reference voltage value. Accordingly, in the case where the comparison voltage value is larger than the reference voltage value as a comparison result of the comparison unit 410, the resistance variable element R is the low resistance state, and in the case where the comparison voltage value is smaller than the reference voltage value as a comparison result of the comparison unit 410, the resistance variable element R is the high resistance state.

In the semiconductor device 401 in FIG. 4A or 402 in FIG. 4B, the voltage division scheme in FIG. 3 for generating a reference voltage to be compared with a voltage corresponding to the resistance value of a resistance variable element is eliminated, and instead, voltages as two inputs and two input bars are inputted to the comparison unit 410 such that the comparison unit 410 directly receives voltages corresponding to the resistance values of resistive elements R, RA and RB, performs comparison with respect to the received voltages and discriminates the data stored in the resistance variable element R. Hence, the circuit or circuits elements for a configuration for dividing a voltage and generating a reference voltage are eliminated to reduce the area of the semiconductor device. The errors of elements for dividing a voltage are not reflected on a reference voltage under this design and thus data discriminating precision can be improved.

FIG. 5 shows an example of a configuration diagram of the comparison unit 410 included in the semiconductor device 401 of FIG. 4A or the semiconductor device 402 of FIG. 4B.

Referring to FIG. 5, the comparison unit 410 includes a first current sourcing unit SO1 configured to source the current of a first node NO1, a second current sourcing unit SO2 configured to source the current of a second node NO2, a first current sinking unit SH configured to sink the current from the first node NO1 in response to the voltage inputted to the first input terminal IN1 and the voltage inputted to the second input terminal IN2, and a second current sinking unit SI2 configured to sink the current from the second node NO2 in response to the voltage inputted to the first input bar terminal IN1B and the voltage inputted to the second input bar terminal IN2B. The comparison unit 410 further includes a common current sinking unit SIC configured to sink current from a common node NOC to which the first current sinking unit SH and the second current sinking unit SI2 are commonly connected.

The first current sourcing unit SO1 sources the current to the first node NO1 in response to the voltage of the first node NO1, and the second current sourcing unit SO2 sources current to the second node NO2 in response to the voltage of the first node NO1. The first current sourcing unit SO1 may include a PMOS transistor P1 having a source to which the power supply voltage VDD is applied, a drain which is connected to the first node NO1 and a gate to which the voltage of the first node NO1 is inputted. Also, the second current sourcing unit SO2 may include a PMOS transistor P2 having a source to which the power supply voltage VDD is applied, a drain which is connected to the second node NO2 and a gate to which the voltage of the first node NO1 is inputted.

The first current sinking unit SI1 sinks the current from the first node NO1 in response to the voltage inputted to the first input terminal IN1 and the voltage inputted to the second input terminal IN2. An amount of the current sunk from the first node NO1 by the first current sinking unit SI1 corresponds to the sum of the voltage inputted to the first input terminal IN1 and the voltage inputted to the second input terminal IN2. For this operation, the first current sinking unit SI1 may include an NMOS transistor N1 having a drain which is connected to the first node NO1, a source which is connected to the common node NOC and a gate to which the first input IN1 is inputted and an NMOS transistor N2 having a drain which is connected to the first node NO1, a source which is connected to the common node NOC and a gate to which the second input IN2 is inputted.

The second current sinking unit SI2 sinks the current from the second node NO2 in response to the voltage inputted to the first input bar terminal IN1B and the voltage inputted to the second input bar terminal IN2B. An amount of the current sunk from the second node NO2 by the second current sinking unit SI2 corresponds to the sum of the voltage inputted to the first input bar terminal IN1B and the voltage inputted to the second input bar terminal IN2B. For this operation, the second current sinking unit SI2 may include an NMOS transistor N3 having a drain which is connected to the second node NO2, a source which is connected to the common node NOC and a gate to which the first input bar IN1B is inputted and an NMOS transistor N4 having a drain which is connected to the second node NO2, a source which is connected to the common node NOC and a gate to which the second input bar IN2B is inputted. For reference, the second node NO2 is an output node OUT of the comparison unit 410.

The common sinking unit SIC may include a current source IS which is enabled in the read operation and sinks the current from the common node NOC to the terminal of the ground voltage VSS.

In a read operation, the sum of the voltages inputted to the first input terminal IN1 and the second input terminal IN2 is larger than the sum of the voltages inputted to the first input bar terminal IN1B and the second input bar terminal IN2B, the amount of the current sunk from the first node NO1 by the first current sinking unit SI1 is larger than the amount of the current sunk from the second node NO2 by the second current sinking unit SI2. Accordingly, the voltage of the first node NO1 falls to a voltage corresponding to a low level, and the voltage of the second node NO2 rises to a voltage corresponding to a high level. Thus, the output of the comparison unit 410 becomes a high level.

Conversely, in the case where the sum of the voltages inputted to the first input terminal IN1 and the second input terminal IN2 is smaller than the sum of the voltages inputted to the first input bar terminal IN1B and the second input bar terminal IN2B, the amount of the current sunk from the first node NO1 by the first current sinking unit SI1 is smaller than the amount of the current sunk from the second node NO2 by the second current sinking unit SI2. Accordingly, the voltage of the first node NO1 rises to a voltage corresponding to a high level, and the voltage of the second node NO2 falls to a voltage corresponding to a low level. Thus, the output of the comparison unit 410 becomes a low level.

FIG. 6 shows an example of a configuration diagram of a semiconductor device 600 based on a different design. In FIG. 6, a ground voltage VSS is applied to the ends of cells that are opposite to the ends of the cells that are coupled to the current source 620 and the comparison unit 610.

Referring to FIG. 6, the semiconductor device 600 includes a plurality of resistance variable elements R each configured to be changed in its resistance value according to the value of the data stored therein, one or more first reference resistance elements RA each having a first resistance value, one or more second reference resistance elements RB each having a second resistance value larger than the first resistance value, and a comparison unit 610 configured to be inputted with a voltage corresponding to the resistance value of the resistance variable element R through an input terminal IN thereof (e.g., a first input terminal), be inputted with a voltage corresponding to the first resistance value of the first reference resistance element RA through a first input bar terminal IN1B thereof (e.g., a second input terminal), be inputted with a voltage corresponding to the second resistance value of the second reference resistance element RB through a second input bar terminal IN2B thereof (i.e., a third input terminal), and output a result of comparing an input to the input terminal IN and inputs to the first input bar terminal IN1B and the second input bar terminal IN2B. The semiconductor device 600 further includes a current source 620 configured to flow read current IR to a resistance variable element R selected among the plurality of resistance variable elements R, a first reference resistance element RA corresponding to the selected resistance variable element R among the one or more first reference resistance elements RA and a second reference resistance element RB corresponding to the selected resistance variable element R among the one or more second reference resistance elements RB.

The semiconductor device 600 shown in FIG. 6 has substantially the same configuration as the semiconductor device shown in FIG. 4A except that the comparison unit 610 has one less input for comparison than the comparison unit 410 in FIG. 4A, and operates in substantially the same manner as the semiconductor device shown in FIG. 4A.

In the semiconductor device 600 of FIG. 6, structures, in which a plurality of storage cells SC, one or more first reference cells RC1 and one or more second reference cells RC2 are disposed, a procedure, in which a storage cell SC is selected, and a procedure, in which voltages corresponding to the resistance values of the resistive elements R, RA and RB are generated, are the same as those described above with reference to FIG. 4A.

The comparison unit 610 is inputted with a voltage corresponding to the resistance value of the selected resistance variable element R, through the input terminal IN, is inputted with a voltage corresponding to the first resistance value of the first reference resistance element RA which corresponds to the selected resistance variable element R, through the first input bar terminal IN1B, and is inputted with a voltage corresponding to the second resistance value of the second reference resistance element RB which corresponds to the selected resistance variable element R, through the second input bar terminal IN2B. Also, the comparison unit 610 outputs a result of comparing an input IN with a first input bar IN1B and a second input bar IN2B.

In detail, the comparison unit 610 compares the magnitude of the voltage inputted to the input terminal IN with the magnitude of a voltage having a voltage level between the voltage inputted to the first input bar terminal IN1B and the voltage inputted to the second input bar terminal IN2B. Accordingly, the comparison unit 610 outputs a result of comparing a value (the value of the voltage inputted as the input IN) (hereinafter, referred to as a "comparison voltage value") of the voltage corresponding to the resistance value of the selected resistance variable element R with a value (hereinafter, referred to as a "reference voltage value") of the voltage having a voltage level higher than the voltage corresponding to the first resistance value of the first reference resistance element RA and lower than the voltage corresponding to the second resistance value of the second reference resistance element RB.

In the case where the resistance variable element R is the low resistance state, the resistance value of the resistance variable element R is equal to the first resistance value RL of the first reference resistance element RA, and in the case where the resistance variable element R is the high resistance state, the resistance value of the resistance variable element R is equal to the second resistance value RH of the second reference resistance element RB. Since the amounts of the read currents IR flowing through the cells SC, RC1 and RC2 are the same with one another, in the case where the resistance variable element R is the low resistance state, the voltage corresponding to the resistance value of the resistance variable element R is equal to the voltage corresponding to the first resistance value of the first reference resistance element RA, and in the case where the resistance variable element R is the high resistance state, the voltage corresponding to the resistance value of the resistance variable element R is equal to the voltage corresponding to the second resistance value of the second reference resistance element RB. In other words, in the case where the resistance variable element R is the low resistance state, the voltage corresponding to the resistance value of the resistance variable element R is smaller than the reference voltage value, and in the case where the resistance variable element R is the high resistance state, the voltage corresponding to the resistance value of the resistance variable element R is larger than the reference voltage value. Hence, a comparison result of the comparison unit 610 represents a resistance state of the selected resistance variable element R (a value of the data stored in a storage cell RC).

The output of the comparison unit 610 is controlled by an amount of the current flowing therein, according to the voltages inputted to the input terminal IN, the first input bar terminal IN1B and the second input bar terminal IN2B. The output represents a comparison between an amount of current (hereinafter, referred to as a "comparison current value") flowing in response to the voltage inputted to the input terminal IN with the sum (hereinafter, referred to as a "reference current value") of an amount of current flowing in response to the voltage inputted to the first input bar terminal IN1B and an amount of current flowing in response to the voltage inputted to the second input bar terminal IN2B.

In FIG. 6, the current having a value corresponding to the voltages inputted to the input terminals IN, IN1B and IN2B flows in the comparison unit 610. Therefore, the comparison current value corresponds to the comparison voltage value, and the reference current value corresponds to the reference voltage value. Accordingly, as described above, the comparison result of the comparison unit 610 represents the resistance state of the selected resistance variable element R (the value of the data stored in the storage cell RC).

The operations of the semiconductor device in the case where the ground voltage VSS is applied to the other ends of the cells SC, RC1 and RC2 as shown in FIG. 6 are described below.

Referring to FIG. 6, one end of a selected storage cell SC is connected to the input terminal IN, one end of a selected first reference cell RC1 is connected to the first input bar terminal IN1B, and one end of a selected second reference cell RC2 is connected to the second input bar terminal IN2B.

In the read operation, when the read current IR flows to the selected cells SC, RC1 and RC2 by the current source 620, voltage drops occur at both ends of the resistive elements R, RA and RB of the cells SC, RC1 and RC2. Assuming that the resistance value of the resistance variable element R is RX, the voltage of one end of the resistance variable element R is VSS+IR*RX, the voltage of one end of the first reference resistance element RA is VSS+IR*RL, and the voltage of one end of the second reference resistance element RB is VSS+IR*RH. Accordingly, in the comparison unit 610, the voltage VSS+IR*RX is inputted as the input IN, the voltage VSS+IR*RL is inputted as the first input bar IN1B, and the voltage VSS+IR*RH is inputted as the second input bar IN2B.

The comparison unit 610 outputs a result representing a comparison of the voltage inputted to the input terminal IN with a voltage having a voltage level between the voltage inputted to the first input bar terminal IN1B and the voltage inputted to the second input bar terminal IN2B. The voltage inputted to the input terminal IN is VSS+IR*RX, the voltage inputted to the first input bar terminal IN1B is VSS+IR*RL, and the voltage inputted to the second input bar terminal IN2B is VSS+IR*RH. A voltage VX having a voltage level between the voltage inputted to the first input bar terminal IN1B and the voltage inputted to the second input bar terminal IN2B satisfies the condition of VSS+IR*RL<VX<VSS+IR*RH.

In the case where RX is RL, that is, in the case where the resistance variable element R is the low resistance state, the comparison voltage value is VSS+IR*RL and is thus smaller than the reference voltage value. Conversely, in the case where RX is RH, that is, in the case where the resistance variable element R is the high resistance state, the comparison voltage value is VSS+IR*RH and is thus larger than the reference voltage value. Accordingly, in the case where the comparison voltage value is smaller than the reference voltage value as a comparison result of the comparison unit 610, the resistance variable element R is the low resistance state, and in the case where the comparison voltage value is larger than the reference voltage value as a comparison result of the comparison unit 610, the resistance variable element R is the high resistance state.

While it is illustrated in FIG. 6 that the ground voltage VSS is applied to the other ends of the cells SC, RC1 and RC2, it may be envisaged that the power supply voltage VDD is applied to the other ends of the cells SC, RC1 and RC2 of the semiconductor device of FIG. 6 as shown in FIG. 4B. The configuration and operations of such an implementation are the same as described above with reference to FIG. 4B except that the comparison unit 610 has one input for comparison. In the semiconductor device of FIG. 6, since a configuration for dividing a voltage and generating a reference voltage is not included, the area of the semiconductor device may be reduced, and since the errors of elements necessary to divide a voltage are not reflected on a reference voltage, data discriminating precision may be improved.

FIG. 7 shows an example of a configuration diagram of the comparison unit 610 included in the semiconductor device of FIG. 6.

Referring to FIG. 7, the comparison unit 610 includes a first current sourcing unit SO1 configured to source the current of a first node NO1, a second current sourcing unit SO2 configured to source the current of a second node NO2, a first current sinking unit SI1 configured to sink current from the first node NO1 in response to the voltage inputted to the input terminal IN, and a second current sinking unit SI2 configured to sink current from the second node NO2 in response to the voltage inputted to the first input bar terminal IN1B and the voltage inputted to the second input bar terminal IN2B. The comparison unit 610 further includes a common current sinking unit SIC configured to sink current from a common node NOC to which the first current sinking unit SI1 and the second current sinking unit SI2 are commonly connected.

The first current sourcing unit SO1 sources the current to the first node NO1 in response to the voltage of the first node NO1, and the second current sourcing unit SO2 sources current to the second node NO2 in response to the voltage of the first node NO1. The first current sourcing unit SO1 may include a PMOS transistor P1 having a source to which the power supply voltage VDD is applied, a drain which is connected to the first node NO1 and a gate to which the voltage of the first node NO1 is inputted. Also, the second current sourcing unit SO2 may include a PMOS transistor P2 having a source to which the power supply voltage VDD is applied, a drain which is connected to the second node NO2 and a gate to which the voltage of the first node NO1 is inputted.

The first current sinking unit SI1 sinks the current from the first node NO1 in response to the voltage inputted to the input terminal IN. An amount of current sunk from the first node NO1 by the first current sinking unit SI1 corresponds to the voltage inputted to the input terminal IN. For this operation, the first current sinking unit SI1 may include an NMOS transistor N1 having a drain which is connected to the first node NO1, a source which is connected to the common node NOC and a gate to which the input IN is inputted.

The second current sinking unit SI2 sinks the current from the second node NO2 in response to the voltage inputted to the first input bar terminal IN1B and the voltage inputted to the second input bar terminal IN2B. An amount of current sunk from the second node NO2 by the second current sinking unit SI2 corresponds to the sum of the voltage inputted to the first input bar terminal IN1B and the voltage inputted to the second input bar terminal IN2B. For this operation, the second current sinking unit SI2 may include an NMOS transistor N2 having a drain which is connected to the second node NO2, a source which is connected to the common node NOC and a gate to which the first input bar IN1B is inputted and an NMOS transistor N3 having a drain which is connected to the second node NO2, a source which is connected to the common node NOC and a gate to which the second input bar IN2B is inputted. For reference, the voltage of the second node NO2 becomes the output of the comparison unit 610.

The common sinking unit SIC may include a current source IS which is enabled in the read operation and sinks current from the common node NOC to the terminal of the ground voltage VSS.

The size of the transistor N1 is designed to be larger than the size of the transistors N2 and N3. The size of a transistor is related to an amount of current which flows through the transistor. As the size of a transistor increases, an amount of the current which flows through the transistor in response to the same voltage increases. The transistor N1 may be designed to have a size capable of flowing an amount of the current that is two times larger than an amount of current which flows through the transistor N2 or N3 in response to the same voltage. When the size of the transistor N1 is designed in this way, an amount of current sunk from the first node NO1 by the first current sinking unit SI1 of FIG. 7 in response to the voltage inputted to the input terminal IN is the same as an amount of current sunk from the first node NO1 by the first current sinking unit SI1 of FIG. 5 in response to the voltages inputted to the first input terminal IN1 and the second input terminal IN2.

Accordingly, in the same manner as in the comparison unit 410 of FIG. 5, in FIG. 7, an amount of current sunk by the first current sinking unit SI1 and an amount of current sunk by the second current sinking unit SI2 may be compared, and the voltage inputted to the input terminal IN and the voltages inputted to the first input bar terminal IN1B and the second input bar terminal IN2B may be compared. A value outputted to the output terminal (the second node NO2) of the comparison unit 610 according to the relationship of largeness and smallness between the voltage inputted to the input terminal IN and the voltages inputted to the first input bar terminal IN1B and the second input bar terminal IN2B is the same as described above with reference to FIG. 4.

FIG. 8 shows another example of a configuration diagram of a semiconductor device 800 having memory circuitry, where a ground voltage VSS is applied to the ends of cells that are opposite to the ends of the cells that are coupled to the current source 830 and the comparison unit 820.

Referring to FIG. 8, the semiconductor device 800 includes a plurality of resistance variable elements R each configured to be changed in its resistance value according to the value of the data stored therein, one or more first reference resistance elements RA each having a first resistance value, one or more second reference resistance elements RB each having a second resistance value larger than the first resistance value, a voltage generation unit 810 configured to be inputted with a voltage corresponding to the first resistance value of the first reference resistance element RA through a first input terminal IN1 thereof, be inputted with a voltage corresponding to the second resistance value of the second reference resistance element RB through a second input terminal IN2 thereof, including a first input bar terminal IN1B and a second input bar terminal IN2B connected with an output terminal OUTR thereof, and further configured to output a voltage having a voltage level between an input to the first input terminal IN1 and an input to the second input terminal IN2, to the output terminal OUTR, and a comparison unit 820 configured to output a result of comparing a voltage corresponding to the resistance value of the resistance variable element R and the voltage outputted to the output terminal OUTR of the voltage generation unit 810. The semiconductor device 800 further includes a current source 830 configured to flow read current IR to a resistance variable element R selected among the plurality of resistance variable elements R, a first reference resistance element RA corresponding to the selected resistance variable element R among the one or more first reference resistance elements RA and a second reference resistance element RB corresponding to the selected resistance variable element R among the one or more second reference resistance elements RB.

In the semiconductor device 800 of FIG. 8, structures, in which a plurality of storage cells SC, one or more first reference cells RC1 and one or more second reference cells RC2 are disposed, a procedure, in which a storage cell SC is selected, and a procedure, in which voltages corresponding to the resistance values of the resistive elements R, RA and RB are generated, are the same as those described above with reference to FIG. 4A.

The voltage generation unit 810 is inputted with the voltage corresponding to the first resistance value of the first reference resistance element RA, through the first input terminal IN1, is inputted with the voltage corresponding to the second resistance value of the second reference resistance element RB, through the second input terminal IN2, and outputs a voltage having a voltage level between the two voltages, through the output terminal OUTR.

The comparison unit 820 outputs a result of comparing the voltage corresponding to the resistance value of the resistance variable element R and the voltage outputted to the output terminal OUTR of the voltage generation unit 810. The comparison unit 820 may be a general comparator which compares the voltage levels of the voltages inputted through input terminals. The comparison unit 820 outputs a result of comparing inputs to an input terminal IN and an input bar terminal INB.

The operations of the semiconductor device 800 in the case where the ground voltage VSS is applied to the other ends of the cells SC, RC1 and RC2 as shown in FIG. 8 are described below.

Referring to FIG. 8, one end of a selected storage cell SC is connected to the input terminal IN of the comparison unit 820, and the output terminal OUTR of the voltage generation unit 810 is connected to the input bar terminal INB of the comparison unit 820. Also, one end of the first reference cell RC1 is connected to the first input terminal IN1 of the voltage generation unit 810, one end of the second reference cell RC2 is connected to the second input terminal IN2 of the voltage generation unit 810, and the output terminal OUTR of the voltage generation unit 810 is connected to the first input bar terminal IN1B and the second input bar terminal IN2B of the voltage generation unit 810.

If the read current IR flows to selected cells SC, RC1 and RC2 by the current source 830 in a read operation, voltage drops occur at both ends of the resistive elements R, RA and RB of the cells SC, RC1 and RC2. Assuming that the resistance value of the resistance variable element R is RX, the voltage of one end of the resistance variable element R becomes VSS+IR*RX, the voltage of one end of the first reference resistance element RA becomes VSS+IR*RL, and the voltage of one end of the second reference resistance element RB becomes VSS+IR*RH. Accordingly, a voltage VO outputted to the output terminal OUTR of the voltage generation unit 810 satisfies the condition of VSS+IR*RL<VO<VSS+IR*RH.

The comparison unit 820 outputs a result of comparing the voltage inputted to the input terminal IN and the voltage inputted to the input bar terminal INB. The voltage inputted to the input terminal IN is VSS+IR*RX, and the voltage inputted to the input bar terminal INB is VO. In the case where RX is RL, that is, in the case where the resistance variable element R is the low resistance state, a comparison voltage value is VSS+IR*RL and is thus smaller than VO. Conversely, in the case where RX is RH, that is, in the case where the resistance variable element R is the high resistance state, the comparison voltage value is VSS+IR*RH and is thus larger than VO. Accordingly, in the case where the voltage inputted to the input terminal IN is smaller than the voltage inputted to the input bar terminal INB as a comparison result of the comparison unit 820, the resistance variable element R is the low resistance state, and in the case where the voltage inputted to the input terminal IN is larger than the voltage inputted to the input bar terminal INB as a comparison result of the comparison unit 820, the resistance variable element R is the high resistance state.

While it is illustrated in FIG. 8 that the ground voltage VSS is applied to the other ends of the cells SC, RC1 and RC2, it may be envisaged that the power supply voltage VDD is applied to the other ends of the cells SC, RC1 and RC2 of the semiconductor device of FIG. 8 as shown in FIG. 4B. In the semiconductor device of FIG. 8, since a configuration for dividing a voltage and generating a reference voltage is not included, the area of the semiconductor device may be reduced, and since the errors of elements necessary to divide a voltage are not reflected on a reference voltage, data discriminating precision may be improved.

Figure 9:
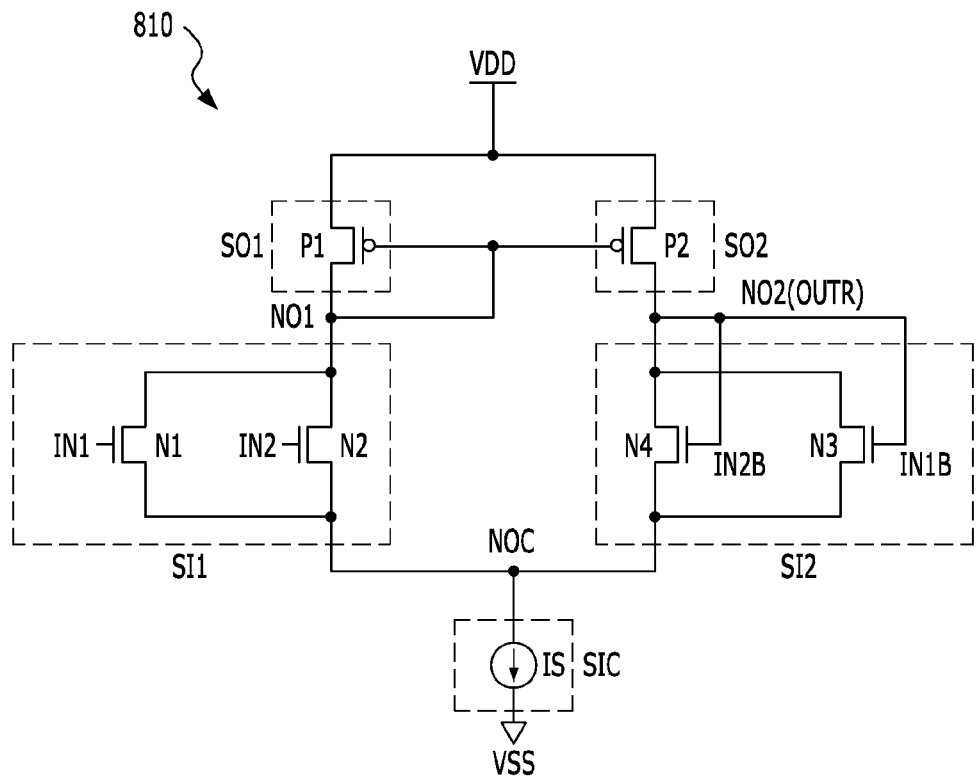
FIG. 9 shows an example of a configuration diagram of the voltage generation unit included in the semiconductor device of FIG. 8.

FIG. 9 is a configuration diagram of the voltage generation unit 810 included in the semiconductor device of FIG. 8.

Referring to FIG. 9, the voltage generation unit 810 includes a first current sourcing unit SO1 configured to source current of a first node NO1, a second current sourcing unit SO2 configured to source current of a second node NO2, a first current sinking unit SI1 configured to sink current from the first node NO1 in response to the voltage inputted to the first input terminal IN1 and the voltage inputted to the second input terminal IN2, and a second current sinking unit SI2 configured to sink current from the second node NO2 in response to the voltage inputted to the first input bar terminal IN1B and the voltage inputted to the second input bar terminal IN2B. The second node NO2 is connected to the first input bar terminal IN1B and the second input bar terminal IN2B. The voltage generation unit 810 further includes a common current sinking unit SIC configured to sink current from a common node NOC to which the first current sinking unit SI1 and the second current sinking unit SI2 are commonly connected.

The first current sourcing unit SO1 sources the current to the first node NO1 in response to the voltage of the first node NO1, and the second current sourcing unit SO2 sources the current to the second node NO2 in response to the voltage of the first node NO1. The first current sourcing unit SO1 may include a PMOS transistor P1 having a source to which the power supply voltage VDD is applied, a drain which is connected to the first node NO1 and a gate to which the voltage of the first node NO1 is inputted. Also, the second current sourcing unit SO2 may include a PMOS transistor P2 having a source to which the power supply voltage VDD is applied, a drain which is connected to the second node NO2 and a gate to which the voltage of the first node NO1 is inputted.

The first current sinking unit SI1 sinks current from the first node NO1 in response to the voltage inputted to the first input terminal IN1 and the voltage inputted to the second input terminal IN2. An amount of the current sunk from the first node NO1 by the first current sinking unit SI1 corresponds to the sum of the voltage inputted to the first input terminal IN1 and the voltage inputted to the second input terminal IN2. For this operation, the first current sinking unit SI1 may include an NMOS transistor N1 having a drain which is connected to the first node NO1, a source which is connected to the common node NOC and a gate to which the first input IN1 is inputted and an NMOS transistor N2 having a drain which is connected to the first node NO1, a source which is connected to the common node NOC and a gate to which the second input IN2 is inputted.

The second current sinking unit SI2 sinks the current from the second node NO2 in response to the voltage inputted to the first input bar terminal IN1B and the voltage inputted to the second input bar terminal IN2B. An amount of the current sunk from the second node NO2 by the second current sinking unit SI2 corresponds to the sum of the voltage inputted to the first input bar terminal IN1B and the voltage inputted to the second input bar terminal IN2B. For this operation, the second current sinking unit SI2 may include an NMOS transistor N3 having a drain which is connected to the second node NO2, a source which is connected to the common node NOC and a gate to which the first input bar IN1B is inputted and an NMOS transistor N4 having a drain which is connected to the second node NO2, a source which is connected to the common node NOC and a gate to which the second input bar IN2B is inputted. The voltage of the second node NO2 becomes the output of the voltage generation unit 810, and the second node NO2 is connected to the first input bar terminal IN1B and the second input bar terminal IN2B.

The common sinking unit SIC may include a current source IS which is enabled in the read operation and sinks current from the common node NOC to the terminal of the ground voltage VSS.

The level of the voltage outputted to the second node NO2 is determined according to an amount of current sunk by the first current sinking unit SI1 and an amount of current sunk by the second current sinking unit SI2. First, in the case where the voltage level of the voltage outputted to the second node NO2 is low and thus the amount of current sunk by the first sinking unit SI1 is larger than the amount of current sunk by the second current sinking unit SI2, the voltage of the second node NO2 tends to rise. Conversely, in the case where the voltage level of the voltage outputted to the second node NO2 is high and thus the amount of the current sunk by the first sinking unit SI1 is smaller than the amount of the current sunk by the second current sinking unit SI2, the voltage of the second node NO2 gradually falls.

The voltage of the second node NO2 is controlled until the amount of current sunk by the first sinking unit SI1 and the amount of current sunk by the second current sinking unit SI2 become about the same with each other. After the control is completed, the voltage level of the voltage outputted to the second node NO2 has a value between the voltage level of the voltage inputted to the first input terminal IN1 and the voltage level of the voltage inputted to the second input terminal IN2. For reference, in the voltage generation unit 810, the second node NO2 is the output terminal OUTR.

Figure 10:
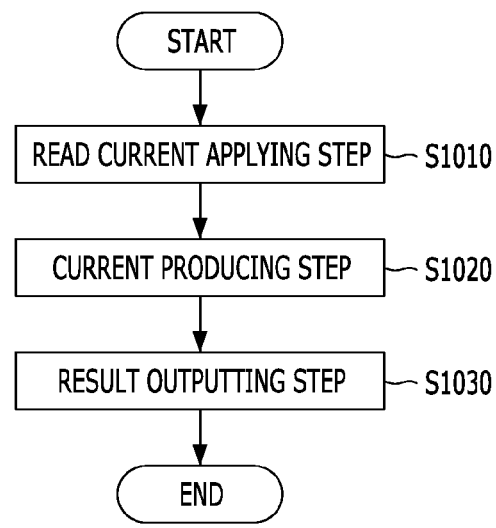
FIG. 10 is a flow chart explaining an example of a method for operating a semiconductor device.

FIG. 10 is a flow chart explaining a method for operating a semiconductor device in accordance with another implementation.

Referring to FIG. 10, a method for operating a semiconductor device, including a resistance variable element R which is changed in its resistance value according to a value of data stored therein, a first reference resistance element RA which has a first resistance value and a second reference resistance element RB which has a second resistance value larger than the first resistance value, includes flowing read current IR to the resistance variable element R, the first reference resistance element RA and the second reference resistance element RB (hereinafter, referred to as 'read current applying step S1010'), producing first current in response to a voltage of one end of the resistance variable element R, second current in response to a voltage of one end of the first reference resistance element RA and third current in response to a voltage of one end of the second reference resistance element RB (hereinafter, referred to as 'current producing step S1020'), and outputting a result of comparing a current amount of the first current with a sum of current amounts of the second current and the third current (hereinafter, referred to as 'result outputting step S1030').

Hereinbelow, the method for operating a semiconductor device will be described with reference to FIGS. 4A and 10.

In the read current applying step S1010, the same read current IR is applied to a selected storage cell SC, a first reference cell RC1 corresponding to the selected resistance variable element R and a second reference cell RC2 corresponding to the selected resistance variable element R. As the read current IR flows through the cells SC, RC1 and RC2, voltage drops occur at both ends of the resistive elements R, RA and RB included in the cells SC, RC1 and RC2, and voltages corresponding to the resistance values of the resistive elements R, RA and RB are generated at one ends of the cells SC, RC1 and RC2. In the case where a ground voltage VSS is applied to the other ends of the cells SC, RC1 and RC2 as shown in FIG. 4A, the voltage corresponding to the resistance value of the resistance variable element R is VSS+IR*RX, the voltage corresponding to the first resistance value of the first reference resistance element RA is VSS+IR*RL, and the voltage corresponding to the second resistance value of the second reference resistance element RB is VSS+IR*RH.

In the current producing step S1020, the first to third current is produced in response to the voltages corresponding to the resistance values of the respective resistive elements R, RA and RB. The first current has the current amount corresponding to the resistance value of the resistance variable element R, the second current has the current amount corresponding to the first resistance value of the first reference resistance element RA, and the third current has the current amount corresponding to the second resistance value of the second reference resistance element RB.

In the result outputting step S1030, the value stored in the resistance variable element R is discriminated according to a result of comparing the current amount of the first current and the sum of the current amounts of the second current and the third current. A way of discriminating the value stored in the resistance variable element R according to a comparison result is the same as described above with reference to FIG. 4A.

While it is explained in FIG. 10 that the ground voltage VSS is applied to the other ends of the cells SC, RC1 and RC2, the semiconductor device operating method of FIG. 10 may be applied to a semiconductor device in which a power supply voltage VDD is applied to the other ends of the cells SC, RC1 and RC2 as shown in FIG. 4B. When the semiconductor device operating method according to the present implementation is used, since the semiconductor device does not include a configuration for dividing a voltage and generating a reference voltage, the area of the semiconductor device may be reduced, and since the errors of elements necessary to divide a voltage are not reflected on a reference voltage, data discriminating precision may be improved.

The above and other memory circuits or semiconductor devices based on the disclosed technology can be used in a range of devices or systems. FIGS. 11-15 provide some examples of devices or systems that can implement the memory circuits disclosed herein.

Figure 11:
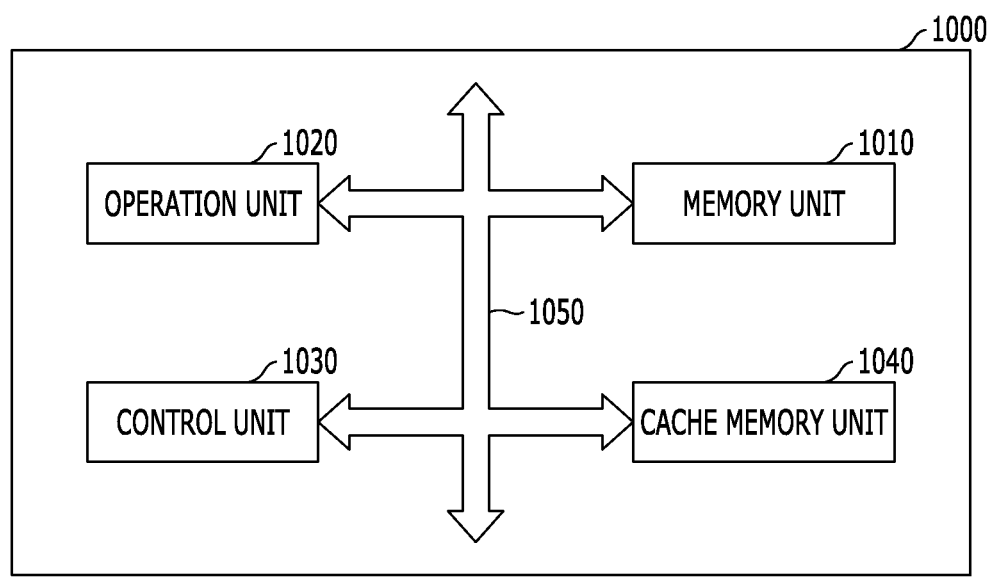
FIG. 11 shows an example of a configuration diagram of a microprocessor implementing memory circuitry based on the disclosed technology.

FIG. 11 shows an example of a configuration diagram of a microprocessor based on another implementation of the disclosed technology.

Referring to FIG. 11, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. For example, the memory unit 1010 implementation may include a resistance variable element configured to be changed in a resistance value according to a value of data stored therein, a first reference resistance element having a first resistance value, a second reference resistance element having a second resistance value larger than the first resistance value and a comparison unit configured to receive a voltage corresponding to the resistance value of the resistance variable element through a first input terminal and a second input terminal thereof, a voltage corresponding to the first resistance value of the first reference resistance element through a third input terminal, and a voltage corresponding to the second resistance value of the second reference resistance element through a fourth input terminal, the comparison unit configured to output a result of comparing inputs to the first input terminal and the second input terminal and inputs to the third input terminal and fourth input terminal. Since a configuration (or elements) for generating a reference voltage is not included, an area may be reduced and errors by elements may be decreased by which data discriminating precision may be improved. Through this, the area of the memory unit 1010 may be reduced and the operating precision of the memory unit 1010 may be improved. Since the memory unit 1010 according to the present implementation may be reduced in area and may be improved in operating precision, the microprocessor 1000 may be reduced in area and may be improved in performance.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 12:
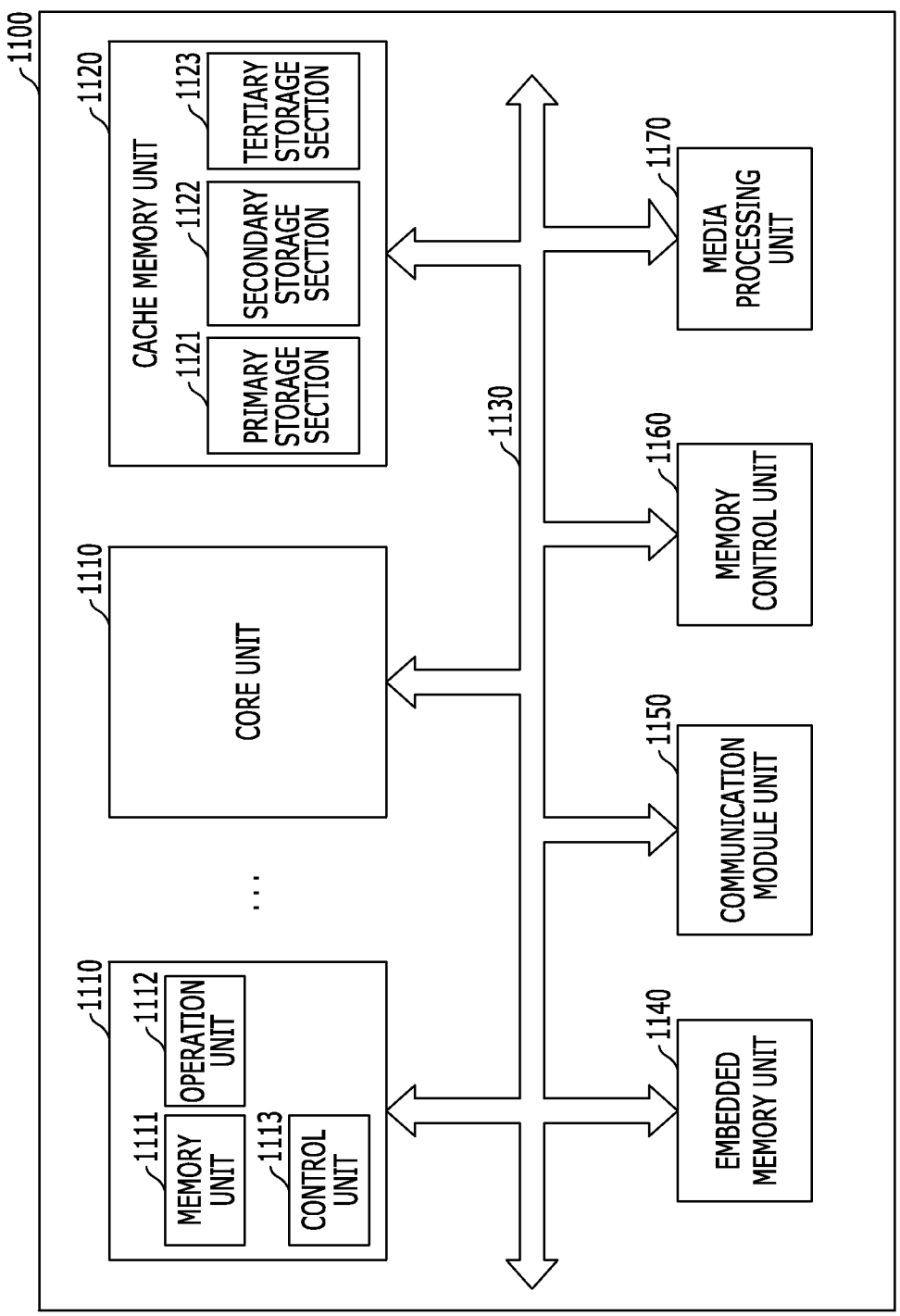
FIG. 12 shows an example of a configuration diagram of a processor implementing memory circuitry based on the disclosed technology.

FIG. 12 is a configuration diagram of a processor based on another implementation of the disclosed technology.

Referring to FIG. 12, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 implementation may include a resistance variable element configured to be changed in a resistance value according to a value of data stored therein, a first reference resistance element having a first resistance value, a second reference resistance element having a second resistance value larger than the first resistance value and a comparison unit configured to receive a voltage corresponding to the resistance value of the resistance variable element through a first input terminal and a second input terminal thereof, a voltage corresponding to the first resistance value of the first reference resistance element through a third input terminal, and a voltage corresponding to the second resistance value of the second reference resistance element through a fourth input terminal, the comparison unit configured to output a result of comparing inputs to the first input terminal and the second input terminal and inputs to the third input terminal and fourth input terminal. Since a configuration (or elements) for generating a reference voltage is not included, an area may be reduced and errors by elements may be decreased by which data discriminating precision may be improved. Through this, the area of the cache memory unit 1120 may be reduced and the operating precision of the cache memory unit 1120 may be improved. Since the cache memory unit 1120 according to the present implementation may be reduced in area and may be improved in operating precision, the core unit 1110 may be reduced in area and may be improved in performance.

Although it was shown in FIG. 12 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 13:
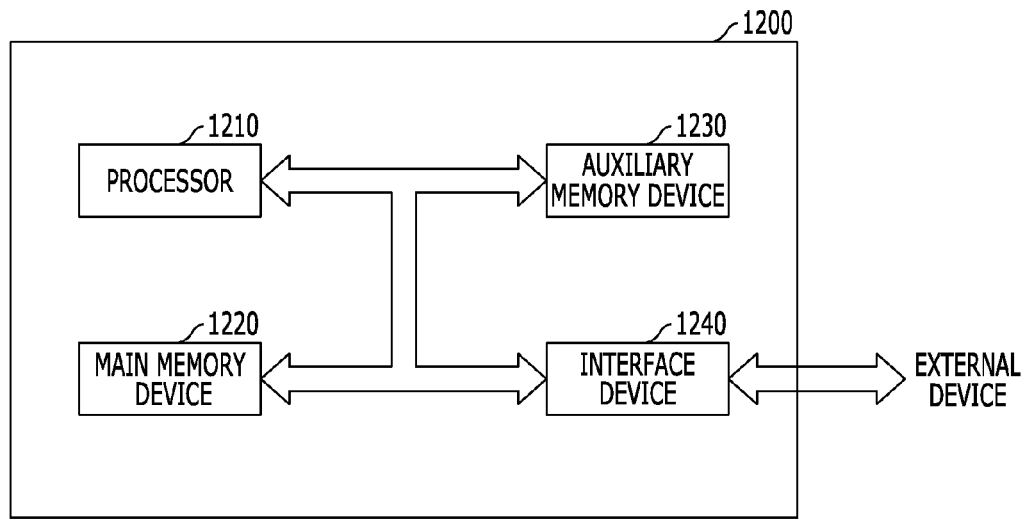
FIG. 13 shows an example of a configuration diagram of a system implementing memory circuitry based on the disclosed technology.

FIG. 13 is a configuration diagram of a system based on another implementation of the disclosed technology.

Referring to FIG. 13, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a resistance variable element configured to be changed in a resistance value according to a value of data stored therein, a first reference resistance element having a first resistance value, a second reference resistance element having a second resistance value larger than the first resistance value and a comparison unit configured to receive a voltage corresponding to the resistance value of the resistance variable element through a first input terminal and a second input terminal thereof, a voltage corresponding to the first resistance value of the first reference resistance element through a third input terminal, and a voltage corresponding to the second resistance value of the second reference resistance element through a fourth input terminal, the comparison unit configured to output a result of comparing inputs to the first input terminal and the second input terminal and inputs to the third input terminal and fourth input terminal. Since a configuration (or elements) for generating a reference voltage is not included, an area may be reduced and errors by elements may be decreased by which data discriminating precision may be improved. Through this, the area of the main memory device 1220 may be reduced and the operating precision of the main memory device 1220 may be improved. Since the main memory device 1220 according to the present implementation may be reduced in area and may be improved in operating precision, the system 1200 may be reduced in size and may be improved in portability and performance.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a resistance variable element configured to be changed in a resistance value according to a value of data stored therein, a first reference resistance element having a first resistance value, a second reference resistance element having a second resistance value larger than the first resistance value and a comparison unit configured to receive a voltage corresponding to the resistance value of the resistance variable element through a first input terminal and a second input terminal thereof, a voltage corresponding to the first resistance value of the first reference resistance element through a third input terminal, and a voltage corresponding to the second resistance value of the second reference resistance element through a fourth input terminal, the comparison unit configured to output a result of comparing inputs to the first input terminal and the second input terminal and inputs to the third input terminal and fourth input terminal. Since a configuration (or elements) for generating a reference voltage is not included, an area may be reduced and errors by elements may be decreased by which data discriminating precision may be improved. Through this, the area of the auxiliary memory device 1230 may be reduced and the operating precision of the auxiliary memory device 1230 may be improved. Since the auxiliary memory device 1230 according to the present implementation may be reduced in area and may be improved in operating precision, the system 1200 may be reduced in size and may be improved in portability and performance.

Also, the auxiliary memory device 1230 may further include a data storage system (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 14:
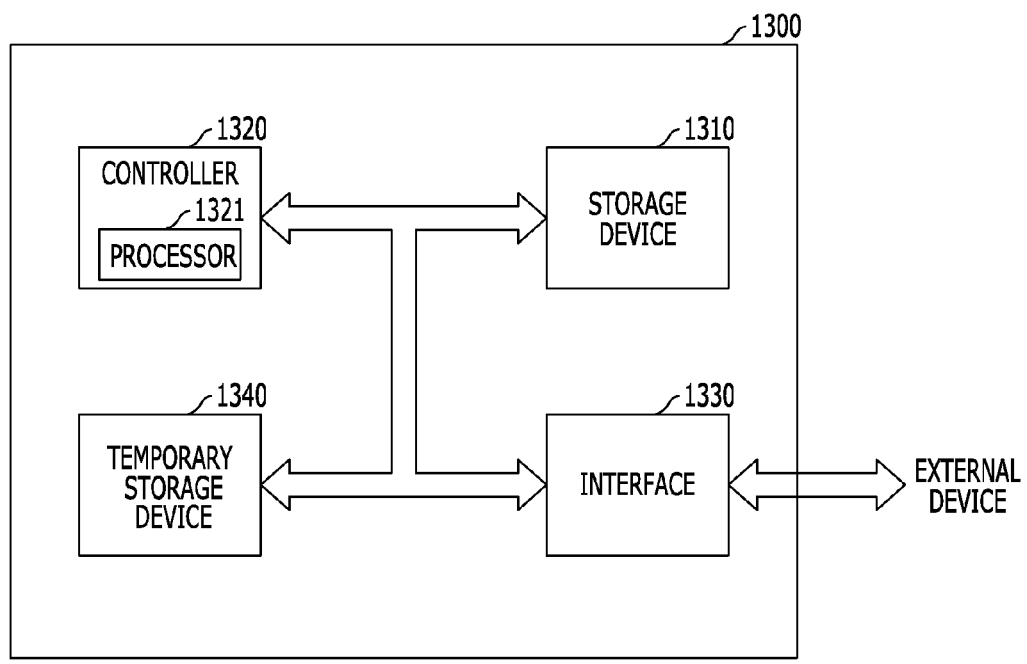
FIG. 14 shows an example of a configuration diagram of a data storage system implementing memory circuitry based on the disclosed technology.

FIG. 14 is a configuration diagram of a data storage system based on another implementation of the disclosed technology.

Referring to FIG. 14, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily implementation for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 implementation may include a resistance variable element configured to be changed in a resistance value according to a value of data stored therein, a first reference resistance element having a first resistance value, a second reference resistance element having a second resistance value larger than the first resistance value and a comparison unit configured to receive a voltage corresponding to the resistance value of the resistance variable element through a first input terminal and a second input terminal thereof, a voltage corresponding to the first resistance value of the first reference resistance element through a third input terminal, and a voltage corresponding to the second resistance value of the second reference resistance element through a fourth input terminal, the comparison unit configured to output a result of comparing inputs to the first input terminal and the second input terminal and inputs to the third input terminal and fourth input terminal. Since a configuration (or elements) for generating a reference voltage is not included, an area may be reduced and errors by elements may be decreased by which data discriminating precision may be improved. Through this, the area of the storage device 1310 or the temporary storage device 1340 may be reduced and the operating precision of the storage device 1310 or the temporary storage device 1340 may be improved. Since the storage device 1310 or the temporary storage device 1340 according to the present implementation may be reduced in area and may be improved in operating precision, the data storage system 1300 may be reduced in size and may be improved in portability and performance.

Figure 15:
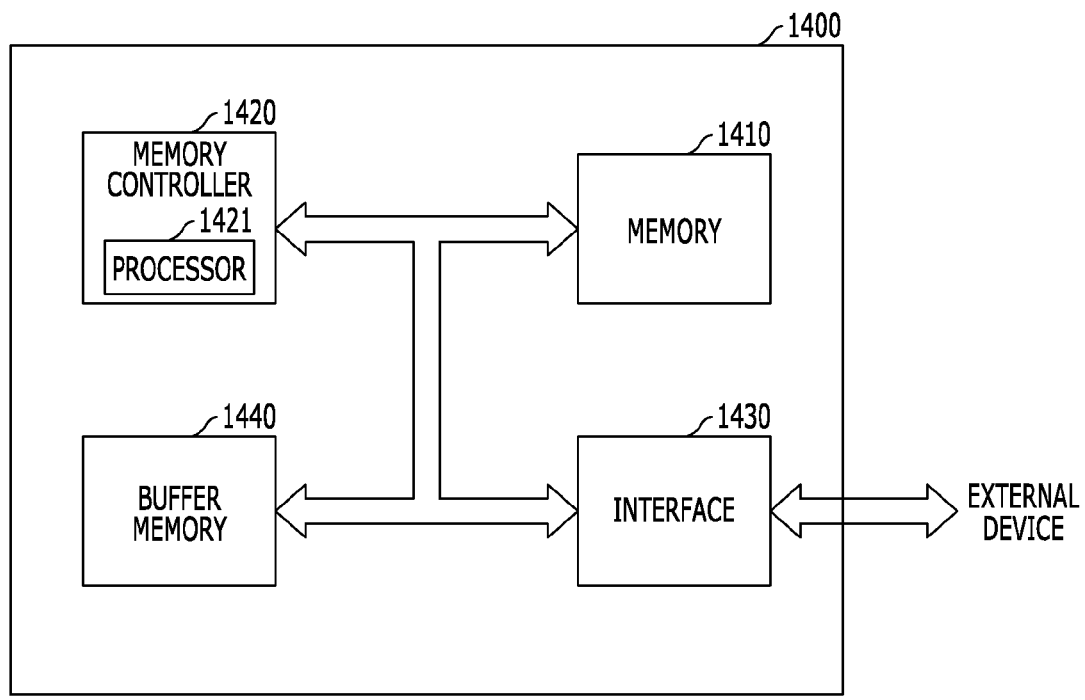
FIG. 15 shows an example of a configuration diagram of a memory system implementing memory circuitry based on the disclosed technology.

FIG. 15 is a configuration diagram of a memory system based on another implementation of the disclosed technology.

Referring to FIG. 15, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a resistance variable element configured to be changed in a resistance value according to a value of data stored therein, a first reference resistance element having a first resistance value, a second reference resistance element having a second resistance value larger than the first resistance value and a comparison unit configured to receive a voltage corresponding to the resistance value of the resistance variable element through a first input terminal and a second input terminal thereof, a voltage corresponding to the first resistance value of the first reference resistance element through a third input terminal, and a voltage corresponding to the second resistance value of the second reference resistance element through a fourth input terminal, the comparison unit configured to output a result of comparing inputs to the first input terminal and the second input terminal and inputs to the third input terminal and fourth input terminal. Since a configuration (or elements) for generating a reference voltage is not included, an area may be reduced and errors by elements may be decreased by which data discriminating precision may be improved. Through this, the area of the memory 1410 may be reduced and the operating precision of the memory 1410 may be improved. Since the memory 1410 according to the present implementation may be reduced in area and may be improved in operating precision, the memory system 1400 may be reduced in size and may be improved in portability and performance.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 implementation may include a resistance variable element configured to be changed in a resistance value according to a value of data stored therein, a first reference resistance element having a first resistance value, a second reference resistance element having a second resistance value larger than the first resistance value and a comparison unit configured to receive a voltage corresponding to the resistance value of the resistance variable element through a first input terminal and a second input terminal thereof, a voltage corresponding to the first resistance value of the first reference resistance element through a third input terminal, and a voltage corresponding to the second resistance value of the second reference resistance element through a fourth input terminal, the comparison unit configured to output a result of comparing inputs to the first input terminal and the second input terminal and inputs to the third input terminal and fourth input terminal. Since a configuration (or elements) for generating a reference voltage is not included, an area may be reduced and errors by elements may be decreased by which data discriminating precision may be improved. Through this, the area of the buffer memory 1440 may be reduced and the operating precision of the buffer memory 1440 may be improved. Since the buffer memory 1440 according to the present implementation may be reduced in area and may be improved in operating precision, the memory system 1400 may be reduced in size and may be improved in portability and performance.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 11-15 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated.

What is claimed is:

1. An electronic device comprising a semiconductor memory unit that includes:
   a resistance variable element configured to exhibit a first resistance value for storing first data and a second resistance value larger than the first resistance value for storing second data different from the first data;
   a first reference resistance element having a first reference resistance value and electrically coupled to be separate from the resistance variable element without having a current to flow through both the first reference resistance element and the resistance variable element in operating the semiconductor memory unit;
   a second reference resistance element having a second reference resistance value and electrically coupled to be separate from the resistance variable element without having a current to flow through both the second reference resistance element and the resistance variable element in operating the semiconductor memory unit; and
   a comparison unit configured to receive a voltage corresponding to the resistance value of the resistance variable element through a first input terminal and a second input terminal thereof, a voltage corresponding to the first reference resistance value of the first reference resistance element through a third input terminal, and a voltage corresponding to the second reference resistance value of the second reference resistance element through a fourth input terminal, the comparison unit configured to output a result of comparing a sum of the voltage inputted to the first input terminal and the voltage inputted to the second input terminal and a sum of the voltage inputted to the third input terminal and the voltage inputted to the fourth input terminal and to determine whether a resistance value of the resistance variable element represents the first data or the second data.

2. The electronic device according to claim 1, further comprising:
   a first current source configured to supply a read current to the resistance variable element;
   a second current source configured to supply the read current to the first reference resistance element; and
   a third current source configured to supply the read current to the second reference resistance element.

3. The electronic device according to claim 2, wherein one end of the resistance variable element is connected to the first input terminal and the second input terminal, one end of the first reference resistance element is connected to the third input terminal, one end of the second reference resistance element is connected to the fourth input terminal, and a power supply voltage is applied to the other ends of the resistance variable element, the first reference resistance element and the second reference resistance element.

4. The electronic device according to claim 2, wherein one end of the resistance variable element is connected to the first input terminal and the second input terminal, one end of the first reference resistance element is connected to the third input terminal, one end of the second reference resistance element is connected to the fourth input terminal, and a ground voltage is applied to the other ends of the resistance variable element, the first reference resistance element and the second reference resistance element.

5. The electronic device according to claim 1, wherein the comparison unit comprises:
   a first current sourcing unit configured to source a current of a first node;
   a second current sourcing unit configured to source a current of a second node;
   a first current sinking unit configured to sink a current from the first node in response to the voltage inputted to the first input terminal and the voltage inputted to the second input terminal; and
   a second current sinking unit configured to sink a current from the second node in response to the voltage inputted to the third input terminal and the voltage inputted to the fourth input terminal.

6. The electronic device according to claim 1, wherein the resistance variable element comprises a metal oxide, a phase change substance or a structure in which a tunnel barrier layer is interposed between two ferromagnetic layers.

7. The electronic device according to claim 1, further comprising a microprocessor which includes:
   a control unit that is configured to receive a signal including a command from an outside of the microprocessor, and performs extracting, decoding of the command, or controlling input or output of a signal of microprocessor; and
   an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

8. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the resistance variable element is part of the cache memory unit in the processor.

9. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between the processor, the auxiliary memory device or the main memory device and the outside,
wherein the semiconductor memory unit that includes the resistance variable element is part of the auxiliary memory device or the main memory device in the processing system.

10. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit that includes the resistance variable element is part of the storage device or the temporary storage device in the data storage system.

11. The electronic device according to claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory unit that includes the resistance variable element is part of the memory or the buffer memory in the memory system.

12. An electronic device comprising a semiconductor memory unit that includes:
a resistance variable element configured to exhibit a first resistance value for storing first data and a second resistance value larger than the first resistance value for storing second data different from the first data;
a first reference resistance element having a first reference resistance value;
a second reference resistance element having a second reference resistance value; and
a comparison unit configured to receive a voltage corresponding to the resistance value of the resistance variable element through a first input terminal and a second input terminal thereof, a voltage corresponding to the first reference resistance value of the first reference resistance element through a third input terminal, and a voltage corresponding to the second reference resistance value of the second reference resistance element through a fourth input terminal, the comparison unit configured to output a result of comparing a sum of the voltage inputted to the first input terminal and the voltage inputted to the second input terminal and a sum of the voltage inputted to the third input terminal and the voltage inputted to the fourth input terminal and to determine whether a resistance value of the resistance variable element represents the first data or the second data,
wherein the comparison unit is controlled in an amount of a current flowing therein, according to the voltages inputted to the first input terminal, the second input terminal, the third input terminal and the fourth input terminal, and outputs a result of comparing a sum of an amount of a current flowing in response to the voltage inputted to the first input terminal and an amount of a current flowing in response to the voltage inputted to the second input terminal with a sum of an amount of a current flowing in response to the voltage inputted to the third input terminal and an amount of a current flowing in response to the voltage inputted to the fourth input terminal.

13. An electronic device comprising a semiconductor memory unit that includes:
a resistance variable element configured to be changed in a resistance value according to a value of data stored therein;
a first reference resistance element having a first resistance value;
a second reference resistance element having a second resistance value larger than the first resistance value; and
a comparison unit configured to receive a voltage corresponding to the resistance value of the resistance variable element through a first input terminal and a second input terminal thereof, a voltage corresponding to the first resistance value of the first reference resistance element through a third input terminal, and a voltage corresponding to the second resistance value of the second reference resistance element through a fourth input terminal, the comparison unit configured to output a result of comparing inputs to the first input terminal and the second input terminal and inputs to the third input terminal and fourth input terminal, wherein the semiconductor memory unit further includes:
in addition to the resistance variable element, a plurality of additional resistance variable elements each configured to be changed in a resistance value according to the value of the data stored therein;
in addition to the first reference resistance element, one or more additional first reference resistance elements each having a respective first resistance value; and
in addition to the second reference resistance element, one or more additional second reference resistance elements each having a respective second resistance value larger than the respective first resistance value;
wherein the electronic device further includes a current source which is configured to supply a read current to a resistance variable element selected among the plurality of resistance variable elements, a first reference resistance element corresponding to the selected resistance variable element among the first reference resistance elements and a second reference resistance element corresponding to the selected resistance variable element among the second reference resistance elements; and
wherein the comparison unit is configured to receive a voltage of one end of the selected resistance variable element through a first input terminal and a second input terminal thereof, a voltage of one end of the first reference resistance element corresponding to the selected resistance variable element through the third input terminal thereof, and a voltage of one end of the second reference resistance element corresponding to the selected resistance variable element through the fourth input terminal thereof, and the comparison unit is operable to output a result of comparing inputs to the first input terminal and the second input terminal and inputs to the third input terminal and the fourth input terminal.

14. The electronic device according to claim 13, wherein each resistance variable element comprises a metal oxide, a phase change substance or a structure in which a tunnel barrier layer is interposed between two ferromagnetic layers.

15. The electronic device according to claim 13, further comprising a microprocessor which includes:
a control unit that is configured to receive a signal including a command from an outside of the microprocessor, and performs extracting, decoding of the command, or controlling input or output of a signal of microprocessor; and
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit that includes the resistance variable element is part of the memory unit in the microprocessor.

16. The electronic device according to claim 13, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the resistance variable element is part of the cache memory unit in the processor.

17. The electronic device according to claim 13, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between the processor, the auxiliary memory device or the main memory device and the outside,
wherein the semiconductor memory unit that includes the resistance variable element is part of the auxiliary memory device or the main memory device in the processing system.

18. The electronic device according to claim 13, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit that includes the resistance variable element is part of the storage device or the temporary storage device in the data storage system.

19. The electronic device according to claim 13, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory unit that includes the resistance variable element is part of the memory or the buffer memory in the memory system.

20. An electronic device comprising a semiconductor memory unit that includes:
a resistance variable element configured to exhibit a first resistance value for storing first data and a second resistance value larger than the first resistance value for storing the second data different from the first data;
a first reference resistance element having a first reference resistance value;

a second reference resistance element having a second reference resistance value; and a comparison unit coupled to the resistance variable element, the first reference resistance element and the second reference resistance element in three separate circuitry paths that are independent from one another to receive a voltage corresponding to the resistance value of the resistance variable element through an input terminal thereof, a voltage corresponding to the first resistance value of the first reference resistance element through a first input bar terminal thereof, and a voltage corresponding to the second resistance value of the second reference resistance element through a second input bar terminal thereof, and wherein the comparison unit is configured to output a result of comparing the voltage inputted to the input terminal with a voltage having a voltage level between the voltage inputted to the first input bar terminal and the voltage inputted to the second input bar terminal and to determine whether a resistance value of the resistance variable element represents the first data or the second data.

21. The electronic device according to claim 20, wherein the comparison unit is controlled in an amount of a current flowing therein, according to the voltages inputted to the input terminal, the first input bar terminal and the second input bar terminal, and outputs a result of comparing an amount of a current flowing in response to the voltage inputted to the input terminal with a sum of an amount of a current flowing in response to the voltage inputted to the first input bar terminal and an amount of a current flowing in response to the voltage inputted to the second input bar terminal.

22. The electronic device according to claim 20, wherein the resistance variable element includes a magnetic tunnel junction (MTJ) element in which a tunneling barrier layer is interposed between two ferromagnetic layers.

23. The electronic device according to claim 20, wherein the comparison unit comprises:
   a first current sourcing unit configured to source a current of a first node;
   a second current sourcing unit configured to source a current of a second node;
   a first current sinking unit configured to sink a current from the first node in response to the voltage inputted to the input terminal; and
   a second current sinking unit configured to sink a current from the second node in response to the voltage inputted to the first input bar terminal and the voltage inputted to the second input bar terminal.

* * * * *